US012777952B2

(12) United States Patent
Park et al.

(10) Patent No.: US 12,777,952 B2

(45) Date of Patent: Oct. 27, 2026

(54) SEMICONDUCTOR PACKAGE AND METHOD OF MANUFACTURING THE SEMICONDUCTOR PACKAGE

(71) Applicant: Samsung Electronics Co., Ltd., Suwon-si (KR)

(72) Inventors: Hwanjoo Park, Suwon-si (KR); Sunggu Kang, Suwon-si (KR); Jaechoon Kim, Suwon-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 373 days.

(21) Appl. No.: 18/401,872

(22) Filed: Jan. 2, 2024

(65) Prior Publication Data

US 2024/0332150 A1 Oct. 3, 2024

(30) Foreign Application Priority Data

Mar. 27, 2023 (KR) ........................ 10-2023-0039747

(51) Int. Cl.

| | |
|---|---|
| ***H10W 70/685*** | (2026.01) |
| ***H10W 20/20*** | (2026.01) |
| ***H10W 40/22*** | (2026.01) |
| ***H10W 90/00*** | (2026.01) |
| *H10W 74/15* | (2026.01) |

(52) U.S. Cl.

CPC ......... *H10W 70/685* (2026.01); *H10W 20/20* (2026.01); *H10W 40/22* (2026.01); *H10W 90/00* (2026.01); *H10W 90/701* (2026.01); *H10W 74/15* (2026.01); *H10W 90/724* (2026.01); *H10W 90/734* (2026.01)

(58) Field of Classification Search

None

See application file for complete search history.

(56) References Cited

U.S. PATENT DOCUMENTS

| | | | |
|---|---|---|---|
| 7,511,359 | B2 | 3/2009 | Tang et al. |
| 9,842,799 | B2 | 12/2017 | Jang |
| 9,847,285 | B1 | 12/2017 | Sung et al. |

(Continued)

FOREIGN PATENT DOCUMENTS

| | | | |
|---|---|---|---|
| CN | 109698170 | A | 4/2019 |

*Primary Examiner* — Michelle Mandala

(74) *Attorney, Agent, or Firm* — Harness, Dickey & Pierce, P.L.C.

(57) ABSTRACT

A semiconductor package includes a first redistribution wiring layer having first redistribution wirings; a first lower semiconductor chip and a second lower semiconductor chip spaced apart from each other on the first redistribution wiring layer; a sealing member covering the first lower semiconductor chip and the second lower semiconductor chip on the first redistribution wiring layer; a plurality of conductive vias penetrating the sealing member between the first lower semiconductor chip and the second lower semiconductor chip; a second redistribution wiring layer disposed on the sealing member and having second redistribution wirings electrically connected to the plurality of conductive vias; an upper semiconductor chip disposed on the second redistribution wiring layer and electrically connected to the second redistribution wirings; and a first heat dissipation block and a second heat dissipation block respectively disposed on the first lower semiconductor chip and the second lower semiconductor chip.

20 Claims, 16 Drawing Sheets

(56) References Cited

U.S. PATENT DOCUMENTS

| | | | | |
|---|---|---|---|---|
| 11,393,805 | B2 | 7/2022 | Yu et al. | |
| 11,527,518 | B2 | 12/2022 | Chang et al. | |
| 2016/0086870 | A1 * | 3/2016 | Abe | H10W 40/22<br>257/712 |
| 2022/0262780 | A1 | 8/2022 | Jung et al. | |
| 2022/0344304 | A1 | 10/2022 | Pan et al. | |
| 2022/0359358 | A1 * | 11/2022 | Kim | H10W 70/685 |
| 2023/0101149 | A1 * | 3/2023 | Yoo | H10W 40/22<br>257/773 |
| 2024/0040806 | A1 * | 2/2024 | Kim | H10B 80/00 |

* cited by examiner

SEMICONDUCTOR PACKAGE AND METHOD OF MANUFACTURING THE SEMICONDUCTOR PACKAGE

CROSS-REFERENCE TO RELATED APPLICATION

This application claims priority benefit of under 35 U.S.C. § 119 to Korean Patent Application No. 10-2023-0039747, filed on Mar. 27, 2023 in the Korean Intellectual Property Office (KIPO), the disclosures of which are herein incorporated by reference in their entirety.

BACKGROUND

1. Field

Example embodiments relate to a semiconductor package and a method of manufacturing the semiconductor package. More particularly, example embodiments relate to a multi-chip package including a plurality of different chips in a package and a method of manufacturing the same.

2. Description of the Related Art

In a related 3D integrated circuit (IC) package-on-package (POP) package, a lower package may have a dual die stacked structure that includes a lower die provided in a mold and including through-silicon vias (TSVs) formed therein and an upper die stacked on the lower die. Since heat dissipation characteristics of the lower die and the upper die of the dual die stacked structure are deteriorated, the lower die and the upper die may be horizontally spaced from each other on a lower redistribution wiring layer (die separation). However, there is a problem in that a thermal bottleneck occurs because heat sources of each of the horizontally spaced dies do not overlap with the upper package.

SUMMARY

Example embodiments provide a semiconductor package having improved heat dissipation characteristics.

Example embodiments provide a method of manufacturing the semiconductor package.

According to example embodiments, a semiconductor package includes a first redistribution wiring layer including first redistribution wirings: a first lower semiconductor chip and a second lower semiconductor chip on the first redistribution wiring layer such that the first lower semiconductor chip and the second lower semiconductor chip are spaced apart from each other and are electrically connected to the first redistribution wirings: a sealing member on the first redistribution wiring layer and covering at least a portion of the first lower semiconductor chip and the second lower semiconductor chip: a second redistribution wiring layer on the sealing member and including second redistribution wirings: a plurality of conductive vias between the first lower semiconductor chip and the second lower semiconductor chip and penetrating the sealing member such that the plurality of conductive vias electrically connect the first redistribution wirings to the second redistribution wirings; an upper semiconductor chip on the second redistribution wiring layer such that the upper semiconductor chip is electrically connected to the second redistribution wirings: a first heat dissipation block on the first lower semiconductor chip; and a second heat dissipation block on the first lower semiconductor chip and the second lower semiconductor chip.

According to example embodiments, a semiconductor package includes a first redistribution wiring layer including a first chip mounting region and a second chip mounting region spaced apart from each other, a connector region between the first and second chip mounting regions, and first redistribution wirings: a first lower semiconductor chip and a second lower semiconductor chip respectively mounted on the first chip mounting region and on the second chip mounting region: a sealing member covering at least a portion of the first lower semiconductor chip and the second lower semiconductor chip: a second redistribution wiring layer on the sealing member and including second redistribution wirings: a plurality of conductive vias on the connector region, the plurality of conductive vias penetrating the sealing member such that the plurality of conductive vias electrically connect the first redistribution wirings to the second redistribution wirings: an upper semiconductor chip on the second redistribution wiring layer such that the upper semiconductor chip is electrically connected to the second redistribution wirings: a first heat dissipation block on the first lower semiconductor chip; and a second heat dissipation block on the second lower semiconductor chip.

According to example embodiments, a semiconductor package includes a first redistribution wiring layer including a first chip mounting region and a second chip mounting region spaced apart from each other, a connector region between the first and second chip mounting regions, and first redistribution wirings: a first lower semiconductor chip and a second lower semiconductor chip respectively mounted on the first chip mounting region and on the second chip mounting region: a sealing member covering at least a portion of the first lower semiconductor chip and the second lower semiconductor chip; a second redistribution wiring layer on the sealing member and including second redistribution wirings; a plurality of conductive vias on the connector region, the plurality of conductive vias penetrating the sealing member such that the plurality of conductive vias electrically connect the first redistribution wirings to the second redistribution wirings: an upper semiconductor chip on the second redistribution wiring layer such that the upper semiconductor chip is electrically connected to the second redistribution wirings: a first heat dissipation block on the first lower semiconductor chip; and a second heat dissipation block on the second lower semiconductor chip.

According to example embodiments, in a method of manufacturing a semiconductor package, a first redistribution wiring layer having first redistribution wirings is formed. A plurality of conductive vias is formed in a connector region on the first redistribution wiring layer to be electrically connected to the first redistribution wirings. A first lower semiconductor chip and a second lower semiconductor chip are mounted on a first chip mounting region and a second chip mounting region on the first redistribution wiring layer respectively. A molding member is formed on the first redistribution wiring layer to cover the first lower semiconductor chip, the second lower semiconductor chip and the plurality of conductive vias. A second redistribution wiring layer having second redistribution wirings electrically connected to the conductive vias is formed on the molding member. An upper semiconductor chip is mounted on the second redistribution wiring layer to be electrically connected to the second redistribution wirings. A first heat dissipation block and a second heat dissipation block are disposed on the molding member to overlap the first lower semiconductor chip and the second lower semiconductor chip, respectively, with the upper semiconductor chip interposed between the first and second heat dissipation blocks.

According to example embodiments, a first lower semiconductor chip and a second lower semiconductor chip may be spaced apart from each other on a first redistribution wiring layer, and a molding member may be provided on the first redistribution wiring layer to cover the first lower semiconductor chip and the second lower semiconductor chip. A plurality of conductive vias may be disposed between the first lower semiconductor chip and the second lower semiconductor chip on the first redistribution wiring layer to penetrate the molding member.

A second redistribution wiring layer may be disposed on the molding member to cover the plurality of conductive vias, an upper semiconductor chip may be disposed on the second redistribution wiring layer to at least partially overlap the plurality of conductive vias, a first heat dissipation block may be disposed to at least partially overlap the first lower semiconductor chip, and a second heat dissipation block may be disposed to at least partially overlap the second lower semiconductor chip.

Accordingly, the first heat dissipation block and the second heat dissipation block may be arranged in both sides of the upper semiconductor chip and may serve as heat dissipation passages for dissipating heat from the first lower semiconductor chip and the second lower semiconductor chip to the outside. Thus, heat dissipation performance of the semiconductor package may be improved.

BRIEF DESCRIPTION OF THE DRAWINGS

Example embodiments will be more clearly understood from the following detailed description taken in conjunction with the accompanying drawings.

FIG. 1 is a cross-sectional view illustrating a semiconductor package in accordance with example embodiments.

FIG. 2 is a plan view illustrating the semiconductor package in FIG. 1.

FIGS. 3 to 10 are views illustrating a method of manufacturing a semiconductor package in accordance with example embodiments.

FIG. 11 is a cross-sectional view illustrating a semiconductor package in accordance with example embodiments.

FIG. 12 is a plan view illustrating the semiconductor package in FIG. 11.

FIGS. 13 to 15 are cross-sectional views illustrating a method of manufacturing a semiconductor package in accordance with example embodiments.

FIG. 16 is a cross-sectional view illustrating a semiconductor package in accordance with example embodiments.

DETAILED DESCRIPTION

Figure 1:
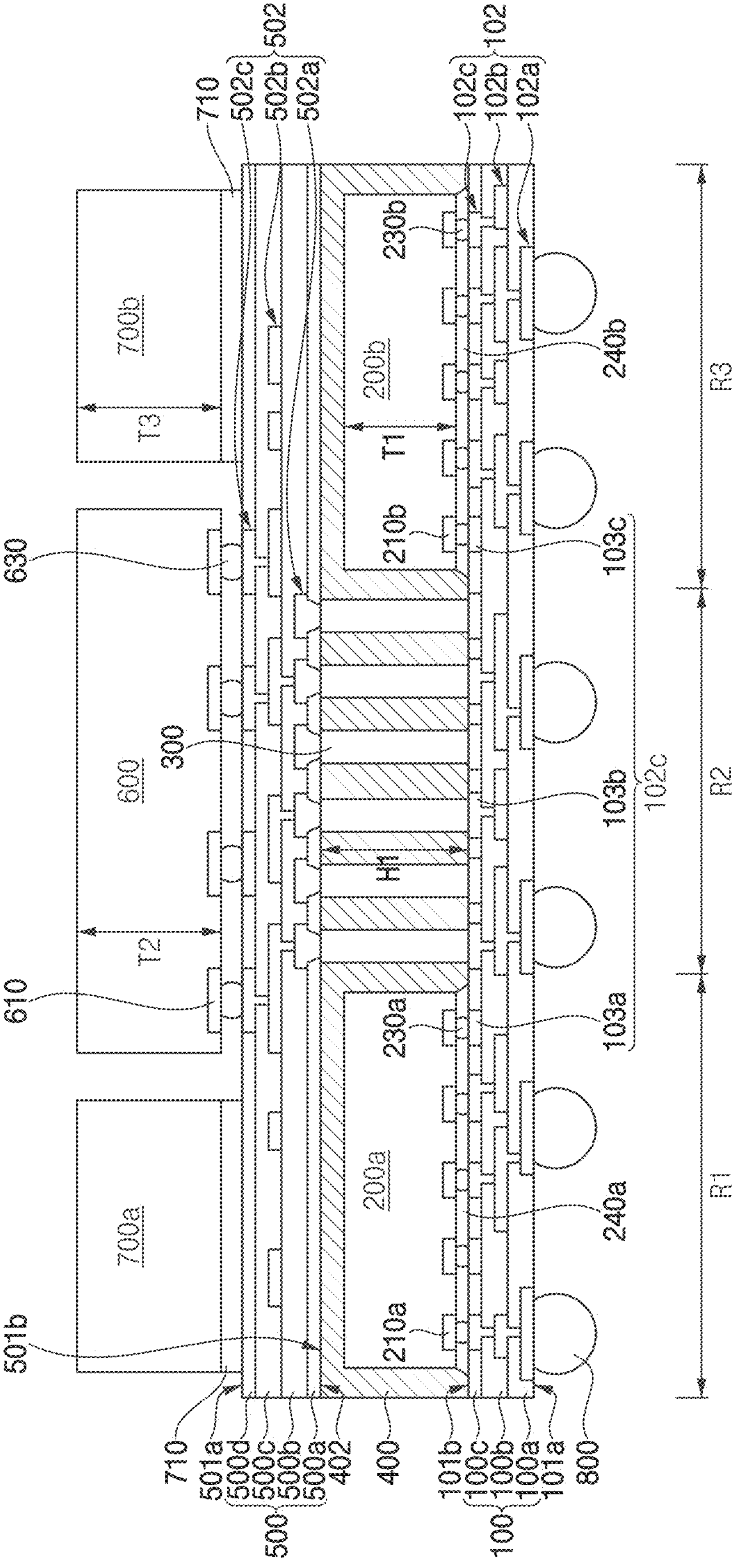
FIGS. 1 to 16 represent non-limiting, example embodiments as described herein.

Hereinafter, example embodiments will be explained in detail with reference to the accompanying drawings, wherein like reference characters denote like elements, unless otherwise noted.

Although the terms "first," "second," "third," etc., may be used herein to describe various elements, components, regions, layers, and/or sections, these elements, components, regions, layers, and/or sections, should not be limited by these terms. These terms are only used to distinguish one element, component, region, layer, or section, from another region, layer, or section. Thus, a first element, component, region, layer, or section, discussed below may be termed a second element, component, region, layer, or section, without departing from the scope of this disclosure.

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, the device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present. Similarly, when an element is referred to as being "on" or "connected to" another element, the element may be directly on, connected to, coupled to, or adjacent to, the other element, or one or more other intervening elements may be present. In contrast, when an element is referred to as being "directly on," "directly connected to," "directly coupled to," or "immediately adjacent to," another element there are no intervening elements present.

When the terms "about" or "substantially" are used in this specification in connection with a numerical value and/or geometric terms, it is intended that the associated numerical value includes a manufacturing tolerance (e.g., ±10%) around the stated numerical value. Further, regardless of whether numerical values and/or geometric terms are modified as "about" or "substantially," it will be understood that these values should be construed as including a manufacturing or operational tolerance (e.g., ±10%) around the stated numerical values and/or geometric. When referring to "within a range of C to D", this means C inclusive to D inclusive unless otherwise specified.

Figure 2:
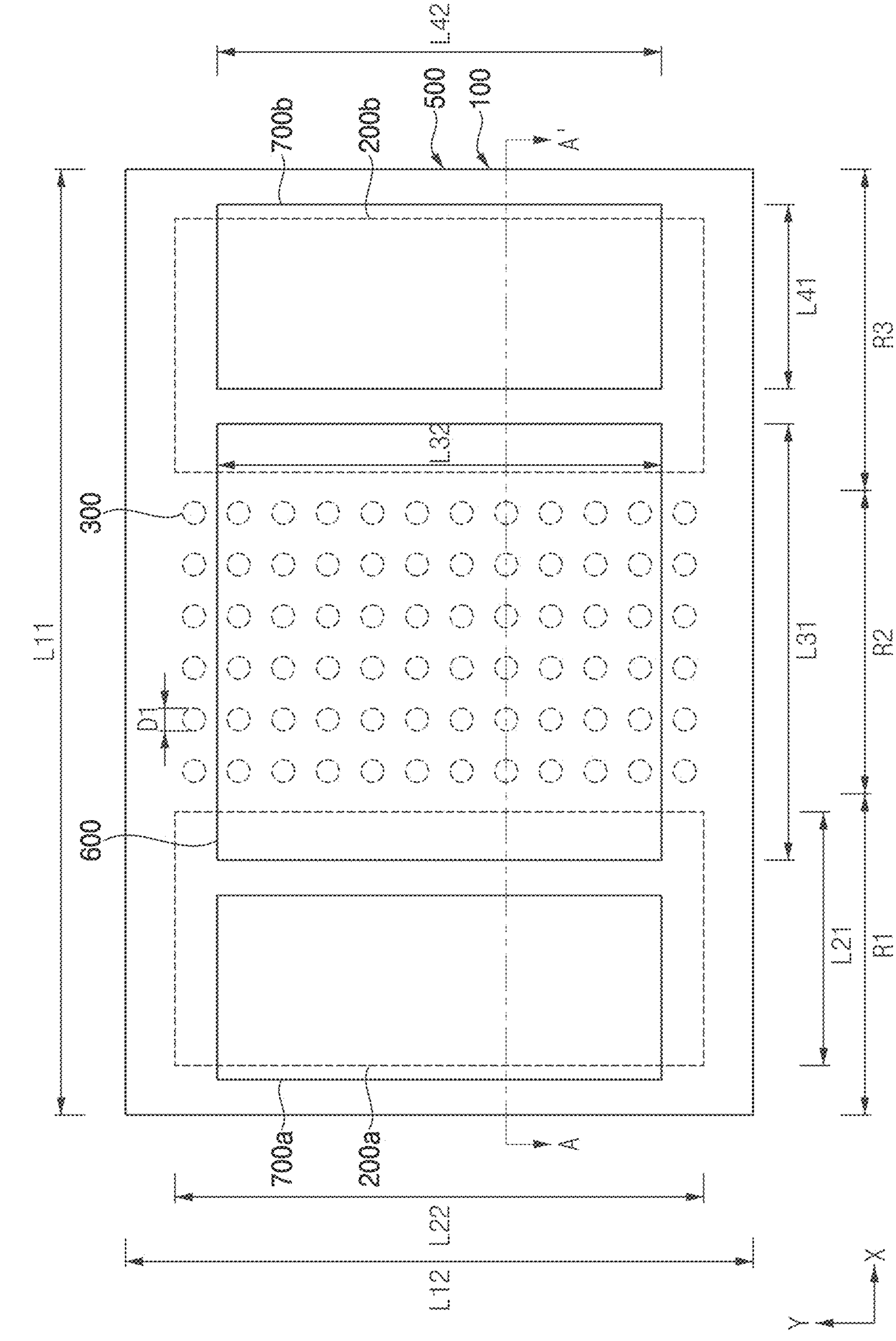

FIG. 1 is a cross-sectional view illustrating a semiconductor package in accordance with example embodiments. FIG. 2 is a plan view illustrating the semiconductor package in FIG. 1. FIG. 1 is a cross-sectional view taken along the line A-A' in FIG. 2.

Referring to FIGS. 1 and 2, in at least some embodiments, a semiconductor package 10 includes a first redistribution wiring layer 100, a first lower semiconductor chip 200*a*, a second lower semiconductor chip 200*b*, a plurality of conductive vias 300, a sealing member 400, a second redistribution wiring layer 500, an upper semiconductor chip 600, a first heat dissipation block 700*a* and a second heat dissipation block 700*b*. In addition, the semiconductor package 10 may further include external connection members 800.

In at least some embodiments, the semiconductor package 10 may be used as a package on package (POP). The semiconductor package 10 may be a multi-chip package (MCP) including different types of semiconductor chips. The semiconductor package 10 may be a system in package (SIP) having a plurality of semiconductor chips stacked and/or arranged in one package to perform all or most of the functions of an electronic system.

In some example embodiments, the first redistribution wiring layer 100 is a front redistribution wiring layer and may include first redistribution wirings 102. The first redistribution wiring layer 100 may include first, second and third lower insulating layers 100*a*, 100*b* and 100*c* stacked on one another and the first redistribution wirings 102 are included in the stacked first, second and third lower insulating layers 100*a*, 100*b* and 100*c*. The first redistribution wirings 102 may include first, second, and third lower redistribution wirings 102*a*, 102*b* and 102*c*. For example, a thickness of the first redistribution wiring layer 100 may be in a range of 5 μm to 50 μm.

The first redistribution wiring layer 100 may have a first surface 101*a* and a second surface 101*b* opposite to the first surface 101*a*. When viewed from a plan view, the first redistribution wiring layer 100 may include a first region R1, a second region R2, and a third region R3 arranged along a first direction (e.g., the X direction). The first region R1 may be a first chip mounting region in which the first lower semiconductor chip 200*a* is mounted on the second surface 101*b* of the first redistribution wiring layer 100, the third region R3 may be a second chip mounting region in which the second lower semiconductor chip 200*b* is mounted on the second surface 101*b* of the first redistribution wiring layer 100, and the second region R2 may be a connector region between the first region R1 and the third region R3, in which the plurality of conductive vias 300 are arranged on the second surface 101*b* of the first redistribution wiring layer 100.

The uppermost redistribution wirings (e.g., the third lower redistribution wirings 102*c*) of the first redistribution wirings 102 includes first uppermost redistribution wirings 103*a* disposed in the first region R1 and electrically connected to first lower chip pads 210*a* of the first lower semiconductor chip 200*a*, second uppermost redistribution wirings 103*b* disposed in the second region R2 and electrically connected to the conductive vias 300, and third uppermost redistribution wirings 103*c* disposed in the third region R3 and electrically connected to second lower chip pads 210*b* of the second lower semiconductor chip 200*b*. Bump pads (such as under bump metallurgy (UBM)) may be formed on redistribution pad portions of the first to third uppermost redistribution wirings 103*a*, 103*b*, and 103*c*, respectively.

Additionally, the first to third uppermost redistribution wirings 103*a*, 103*b*, and 103*c* may be electrically connected to each other. Accordingly, the first lower semiconductor chip 200*a*, the second lower semiconductor chip 200*b*, and the conductive vias 300 may be electrically connected to each other such that, e.g., electrical signals may be transmitted between the first lower semiconductor chip 200*a*, the second lower semiconductor chip 200*b*, and the conductive vias 300.

The first lower insulating layer 100*a* may expose at least portions of the first lower redistribution wirings 102*a*. In at least some embodiments, the first lower insulating layer 100*a* may serve as a passivation layer. A bump pad (not illustrated) such as an under bump metallization (UBM) may be provided on the first lower redistribution wiring 102*a* exposed by the first lower insulating layer 100*a*. In these cases, the exposed portion of the first lower redistribution 102*a* may serve as a landing pad (e.g., a package pad).

The numbers, sizes, arrangements, etc., of the lower insulating layers and the lower redistribution wirings of the first redistribution wiring layer are provided as examples, and it will be understood that the present invention is not limited thereto. For example, numbers, sizes, etc. may be greater than or lower than illustrated, and the arrangement adjusted accordingly.

In some example embodiments, the first lower semiconductor chip 200*a* may be mounted on the second surface 101*b* of the first redistribution wiring layer 100 by a flip chip bonding method. The first lower semiconductor chip 200*a* may be arranged such that a front surface on which the first lower chip pads 210*a* are formed (e.g., an active surface) faces the first redistribution wiring layer 100. The first lower chip pads 210*a* of the first lower semiconductor chip 200*a* may be electrically connected to the first redistribution wirings 102 of the first redistribution wiring layer 100 (e.g., the first uppermost redistribution wirings 103*a*) by first conductive bumps 230*a*.

Similarly to the first lower semiconductor chip, the second lower semiconductor chip 200*b* may be mounted on the second surface 101*b* of the first redistribution wiring layer 100 by a flip chip bonding method. The second lower semiconductor chip 200*b* may be arranged such that a front surface on which the second lower chip pads 210*b* are formed (e.g., an active surface) faces the first redistribution wiring layer 100. The second lower chip pads 210*b* of the second lower semiconductor chip 200*b* may be electrically connected to the first redistribution wirings 102 of the first redistribution wiring layer 100 (e.g., the third uppermost redistribution wirings 103*c*) by second conductive bumps 230*b*.

The first semiconductor chip and/or the second semiconductor chip may be logic chips including logic circuits. The logic chip may be a controller that controls memory chips. The first and second semiconductor chips may be application specific integrated circuits (ASICs) serving as hosts such as central processing units (CPUs), neural processing units (NPUs), graphic processing units (GPUs), and/or systems on chips (SOCs), and/or processor chips such as application processors (APs). For example, the first lower semiconductor chip and the second lower semiconductor chip may include IP blocks. In case that the semiconductor package 10 may include a mobile application processor (AP), IP blocks such as CPU, GPU, NPU, Modem, etc. which may be divided into at least one of the first lower semiconductor chip and the second lower semiconductor chip and mounted thereon.

In at least some embodiments, the first and second conductive bumps 220*a* and 230*b* may include micro bumps (uBumps). The first and second conductive bumps 230*a* and 230*b* may have a diameter in a range of 30 μm to 120 μm. In at least some embodiments, the first and second conductive bumps may include a pillar portion formed on the first or second lower chip pad and a solder portion formed on the pillar portion. The pillar portion may include a conductive material, such as, copper (Cu), nickel (Ni), palladium (Pd), platinum (Pt), gold (Au), cobalt (Co), and/or an alloy thereof. The solder portion may include tin (Sn), indium (In), antimony (Sb), copper (Cu), silver (Ag), zinc (Zn), lead (Pb), and/or a eutectic alloy thereof.

The first and second underfill members 240*a* and 240*b* may be underfilled between the first lower semiconductor chip 200*a* and the first redistribution wiring layer 100 and between the second lower semiconductor chip 200*b* and the first redistribution wiring layer 100. The first and second underfill members 240*a* and 240*b* may include a material having relatively high fluidity, during deposition, to effectively fill small spaces between the first lower semiconductor chip and the first redistribution wiring layer and between the second lower semiconductor chip and the first redistribution wiring layer. The material of the first and second underfill members 240*a* and 240*b* may further be cured after deposition, such that the fluidity of the material decreases (and/or the materials hardens). For example, the first and second underfill members may include an adhesive containing an epoxy material.

In some example embodiments, the conductive vias 300 may be arranged in the second region R2 of the first redistribution wiring layer 100. The conductive vias 300 may extend upward from the first redistribution wirings 102 of the first redistribution wiring layer 100 (e.g., from the second uppermost redistribution wirings 103*b*). The conductive vias 300 may be formed to penetrate the sealing member 400. The conductive vias 300 may be electrically connected to the first redistribution wirings 102.

In some example embodiments, a diameter D1 of the conductive via 300 may be in a range of 30 μm to 100 μm, and a height H1 of the conductive via 300 from the first redistribution wiring layer 100 may be in a range of 200 μm to 300 μm. The conductive via 300 may include a conductive material, such as copper (Cu).

In some example embodiments, the first lower semiconductor chip 200*a* and the second lower semiconductor chip 200*b* may have a first height from the second surface 101*b* of the first redistribution wiring layer 100, and the plurality of conductive vias 300 may have a second height greater than or equal to the first height from the second surface 101*b* of the first redistribution wiring layer 100. For example, thicknesses of the first lower semiconductor chip 200*a* and the second lower semiconductor chip 200*b* may be within a range of 100 μm to 300 μm.

The first redistribution wiring layer 100 may have a rectangular shape extending in more than one direction. For example, the first redistribution wiring layer 100 may have a long side L11 in a first direction (X direction) and a short side L12 in a second direction (Y direction) perpendicular to the first direction. The first redistribution wiring layer 100 may have an area of 15 mm×14 mm (or more). For example, the long side L11 of the first redistribution wiring layer 100 may be 15 mm or more and/or the short side L12 may be 14 mm or more. The first lower semiconductor chip 200*a* and the second lower semiconductor chip 200*b* may each have an area less than the area of the first redistribution wiring layer 100 (e.g., an area of 7 mm×10 mm or more). For example, a length of a side L21 in the first direction of the first lower semiconductor chip 200*a* and the second lower semiconductor chip 200*b* may be 7 mm or more and/or a length of a side L22 may be 10 mm or more.

The lengths of the short side and the long side of the first redistribution wiring layer, the lengths of the short side and long sides and the heights of the first lower semiconductor chip and the second lower semiconductor chip, the arrangement of the conductive vias, etc. are provided as examples, and it will be understood that the present invention is not limited thereto. The lengths of the short side and the long side of the first redistribution wiring layer, the lengths of the short side and long sides and the heights of the first lower semiconductor chip and the second lower semiconductor chip, the arrangement of the conductive vias, etc. may be determined in consideration of the thickness, warpage, and heat dissipation characteristics of the entire package.

In some example embodiments, the sealing member 400 covers the first lower semiconductor chip 200*a*, the second lower semiconductor chip 200*b* and the conductive vias 300 on the second surface 101*b* of the first redistribution wiring layer 100. Upper surfaces of the first lower semiconductor chip 200*a* and the second lower semiconductor chip 200*b* may be covered by the sealing member 400. Upper surfaces of the conductive vias 300 may be exposed by an upper surface 402 of the sealing member 400.

In some example embodiments, the sealing member 400 may include an epoxy molding compound (EMC). For example, sealing member 400 may include at least one of UV resin, polyurethane resin, silicone resin, silica filler, etc.

In some example embodiments, the second redistribution wiring layer 500 as a backside redistribution wiring layer may be disposed on the sealing member 400. The second redistribution wiring layer 500 may include second redistribution wirings 502. The second redistribution wirings 502 may be electrically connected to the conductive vias 300. The second redistribution wiring layer 500 may be disposed on the first lower semiconductor chip 200*a* and the second lower semiconductor chip 200*b*. The second redistribution wiring layer 500 may be arranged to at least partially overlap the plurality of conductive vias 300.

The second redistribution wiring layer 500 may include first, second, third and fourth upper insulating layers 500*a*, 500*b*, 500*c* and 500*d* stacked on one another and the second redistribution wirings 502 in the stacked first, second, third and fourth upper insulating layers 500*a*, 500*b*, 500*c* and 500*d*. The second redistribution wirings 502 may include first, second and third redistribution wirings 502*a*, 502*b* and 502*c*. The second redistribution wiring layer 500 may have a first surface and a second surface 501*a* opposite to the first surface. The second redistribution wirings 502 may be electrically connected to the first redistribution wiring layer 100 through the plurality of conductive vias 300.

The fourth upper insulating layer 500*d* may have openings that expose the third upper redistribution wirings 502*c* respectively. The third upper redistribution wirings 502*c* exposed by the openings may be uppermost redistribution wirings. A portion of the uppermost redistribution may include a redistribution pad portion. Although not illustrated in the figures, a bump pad such as a UBM may be formed on the redistribution pad portion.

The numbers, sizes, arrangements, etc. of the upper insulating layers and the upper redistribution wirings of the second redistribution wiring layer are provided as examples, and it will be understood that the embodiments are not limited thereto.

In some example embodiments, the semiconductor package 10 may be referred to as including a lower package and an upper package stacked on the lower package. The lower package may include the first redistribution wiring layer 100, the first lower semiconductor chip 200*a*, the second lower semiconductor chip 200*b*, the plurality of conductive vias 300, the sealing member 400 and the second redistribution wiring layer 500. The upper package may be disposed on the second redistribution wiring layer 500 of the lower package.

For example, the upper semiconductor chip 600 (as the upper package) may be stacked on the second redistribution wiring layer 500. The upper semiconductor chip 600 may be mounted on an upper surface 501*a* of the second redistribution wiring layer 500 by a flip chip bonding method. The upper semiconductor chip 600 may be arranged such that a front surface on which upper chip pads 610 are formed, that is, an active surface faces the second redistribution wiring layer 500. The upper chip pads 610 of the upper semiconductor chip 600 may be electrically connected to the second redistribution wirings 502 of the second redistribution wiring layer 500 by third conductive bumps 630.

The upper semiconductor chip 600 may be disposed to at least partially overlap the plurality of conductive vias 300. In at least some embodiments, the upper semiconductor chip 600 may include a memory chip. The memory chip may include various types of memory circuits, such as random access memory (RAM), dynamic RAM (DRAM), static RAM (SRAM), flash, phase-change RAM (PRAM), resistive RAM (ReRAM), ferroelectric RAM (FeRAM), magnetoresistive RAM (MRAM), etc. The upper semiconductor chip 600 may be configured to communicate with the first lower semiconductor chip 200*a* and/or the second lower semiconductor chip 200*b* through the first redistribution wiring layer 100 and the second redistribution wiring layer 500. In at least some embodiments, the upper semiconductor chip 600 may be further configured to communicate with an external device through a subset of the external terminals 800.

Although one upper semiconductor chip is illustrated as being mounted on the second redistribution wiring layer 500, it is not limited thereto, and for example, the upper package may include a package substrate and one or more upper semiconductor chips mounted on the package substrate, and the package substrate of the upper package may be mounted on the second redistribution wiring layer via the third conductive bumps.

In example embodiments, the first heat dissipation block 700*a* and the second heat dissipation block 700*b* may be disposed on the second redistribution wiring layer 500. The first heat dissipation block 700*a* and the second heat dissipation block 700*b* may be arranged in opposite sides of the upper semiconductor chip 600 on the second redistribution wiring layer 500.

The first heat dissipation block 700*a* may be disposed on the first lower semiconductor chip 200*a*, and the second heat dissipation block 700*b* may be disposed on the second lower semiconductor chip 200*b*. The first heat dissipation block 700*a* may be arranged to partially overlap the first lower semiconductor chip 200*a*, and the second heat dissipation block 700*b* may be arranged to partially overlap the second lower semiconductor chip 200*b*.

For example, the first heat dissipation block 700*a* and the second heat dissipation block 700*b* may be attached to the upper surface 501*a* of the second redistribution wiring layer 500 by an adhesive film 710 such as a non-conductive adhesive film (NCF). The first heat dissipation block 700*a* and the second heat dissipation block 700*b* may be configured as heatsinks. For example, the first heat dissipation block 700*a* and the second heat dissipation block 700*b* may include a material having excellent thermal conductivity, such as a metal (such as copper) and/or a silicon material.

Heights of the first heat dissipation block 700*a* and the second heat dissipation block 700*b* from the second redistribution wiring layer 500 may be the same as and/or substantially similar to a height of the upper semiconductor chip 600 from the second redistribution wiring layer 500. For example, a thickness T2 of the upper semiconductor chip 600 may be in a range of 0.3 mm to 0.5 mm, and thicknesses T3 of the first heat dissipation block 700*a* and the second heat dissipation block 700*b* may be in a range of 0.4 mm to 0.65 mm. A diameter of the third conductive bump 630 may be within a range of 70 μm to 200 μm. In at least some embodiments, the thicknesses T3 may be larger than the thickness T2 to compensate for the difference in thickness between the third conductive bump 610 and the adhesive film 710, such that the heights of the first heat dissipation block 700*a* and the second heat dissipation block 700*b* are the same as and/or substantially similar to a height of the upper semiconductor chip 600.

The second redistribution wiring layer 500 may have the same shape as the first redistribution wiring layer 100. For example, the second redistribution wiring layer 500 may have a rectangular shape having a long side L11 in a first direction (X direction) and a short side L12 in a second direction (Y direction) perpendicular to the first direction. The second redistribution wiring layer 500 may have an area of 15 mm×14 mm (or more). For example, the long side L11 of the second redistribution wiring layer 500 may be 15 mm or more and/or the short side L12 may be 14 mm or more. The upper semiconductor chip 600 may have an area that is less than the area of the second redistribution layer 500 (e.g., an area of 12 mm×14 mm or more). The first heat dissipation block 700*a* and the second heat dissipation block 700*b* may have an area of 1 mm×15 mm or more. A length of a side L41 in the first direction of the first heat dissipation block 700*a* and the second heat dissipation block 700*b* may be 1 mm or more, and a length of a side L42 in the second direction of the first heat dissipation block 700*a* and the second heat dissipation block 700*b* may have be 15 mm or less.

In some example embodiments, the external connection members 800 for electrical connection with an external device may be disposed on the package pads on the first surface 101*a* of the first redistribution wiring layer 100. For example, the external connection member 800 may be a solder ball or a solder bump. The semiconductor package 10 may be mounted on a module substrate (not illustrated) or an interposer via the solder balls or the solder bumps.

As mentioned above, the semiconductor package 10 may include the first redistribution wiring layer 100 including the first chip mounting region R1, the connector region R2 and the second chip mounting region R3 arranged in the first direction (X direction) and having the first redistribution wirings 102, the first lower semiconductor chip 200*a* mounted on the first chip mounting region R1 on the first redistribution wiring layer 100, the second lower semiconductor chip 200*b* mounted on the second chip mounting region R3 on the first redistribution wiring layer 100, the plurality of conducive vias 300 disposed on the connector region R2 on the first redistribution wiring layer 100 and electrically connected to the first redistribution wirings 102, the sealing member 400 covering the first lower semiconductor chip 200*a*, the second lower semiconductor chip 200*b* and the plurality of conductive vias 300 on the first redistribution wiring layer 100, and the second redistribution wiring layer 500 disposed on the sealing member 400 and having the second redistribution wirings 602 electrically connected to the conductive vias 300, the upper semiconductor chip 700 disposed on the second redistribution wiring layer 500 and electrically connected to the second redistribution wirings 502, the first heat dissipation block 700*a* disposed on the first lower semiconductor chip 200*a*, and the second heat dissipation block 700*b* disposed on the second lower semiconductor chip 200*b*.

The first lower semiconductor chip 200*a* and the second lower semiconductor chip 200*b* may be spaced apart from each other on the first redistribution wiring layer 100, and the plurality of conductive vias 300 may be disposed between the first lower semiconductor chip 200*a* and the second lower semiconductor chip 200*b* on the first redistribution wiring layer 100.

The upper semiconductor chip 600 may be disposed on the second redistribution wiring layer 500 to partially overlap the plurality of conductive vias 300, the first heat dissipation block 700*a* may be disposed on the second redistribution wiring layer 500 to at least partially overlap the first lower semiconductor chip 200*a*, and the second heat dissipation block 700*b* may be disposed on the second redistribution wiring layer 500 to at least partially overlap the second lower semiconductor chip 200*b*.

Accordingly, the first heat dissipation block 700*a* and the second heat dissipation block 700*b* may be arranged in opposite sides of the upper semiconductor chip 600, and may serve as a heat dissipation passage for dissipate heat from the first lower semiconductor chip 200*a* and the second lower semiconductor chip 200*b* to the outside. In at least some example embodiments, the heat dissipation passage conveys heat through thermal conductance; and thus, heat dissipation characteristics of the semiconductor package 10 may be improved.

Hereinafter, a method of manufacturing the semiconductor package of FIG. 1 will be described.

Figure 3:
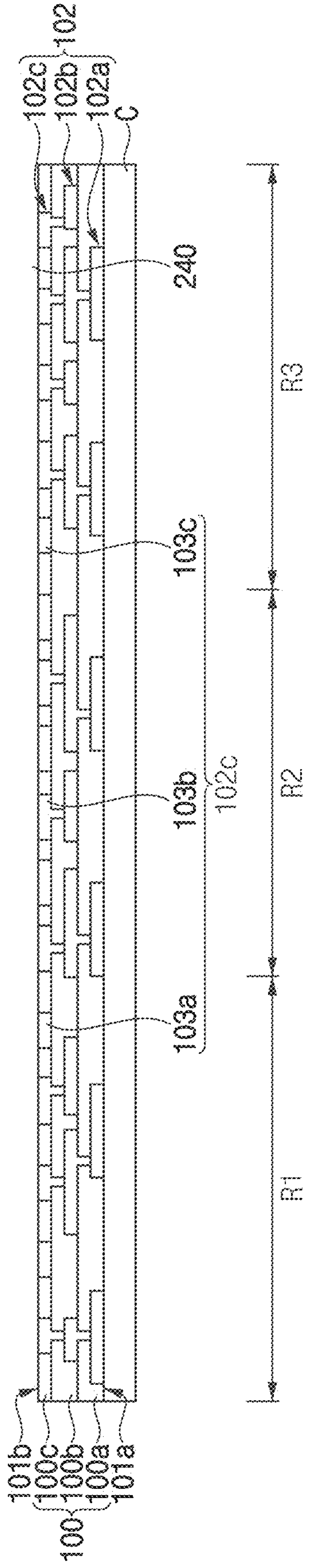
Figure 4:
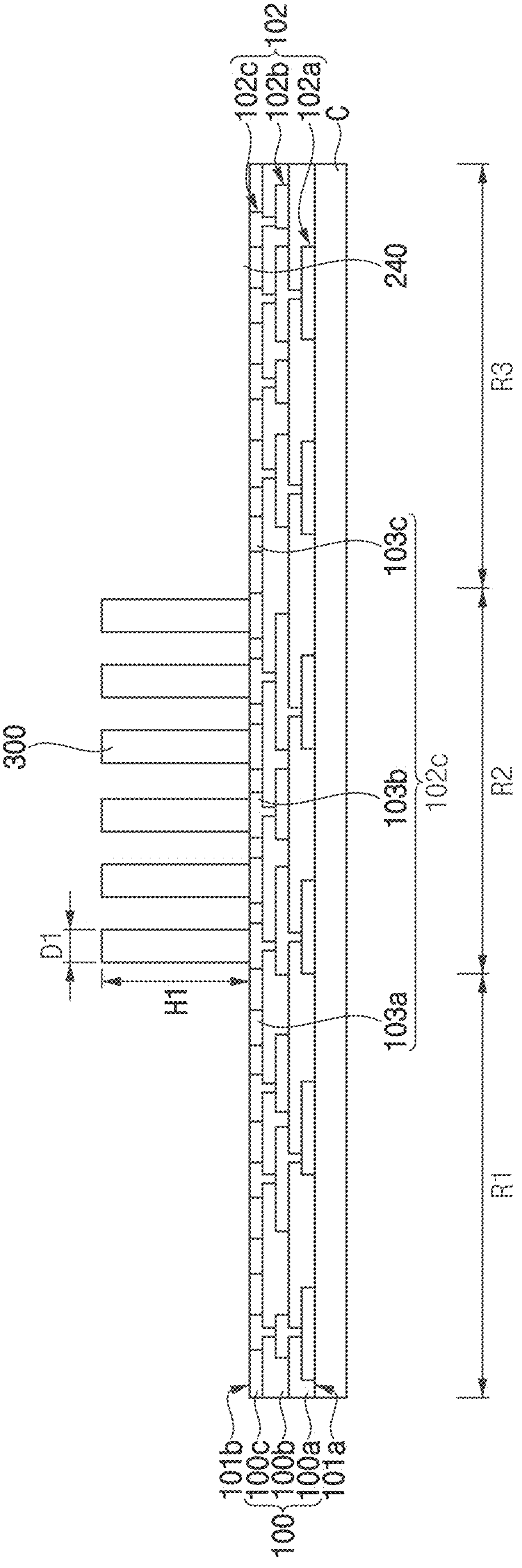
Figure 5:
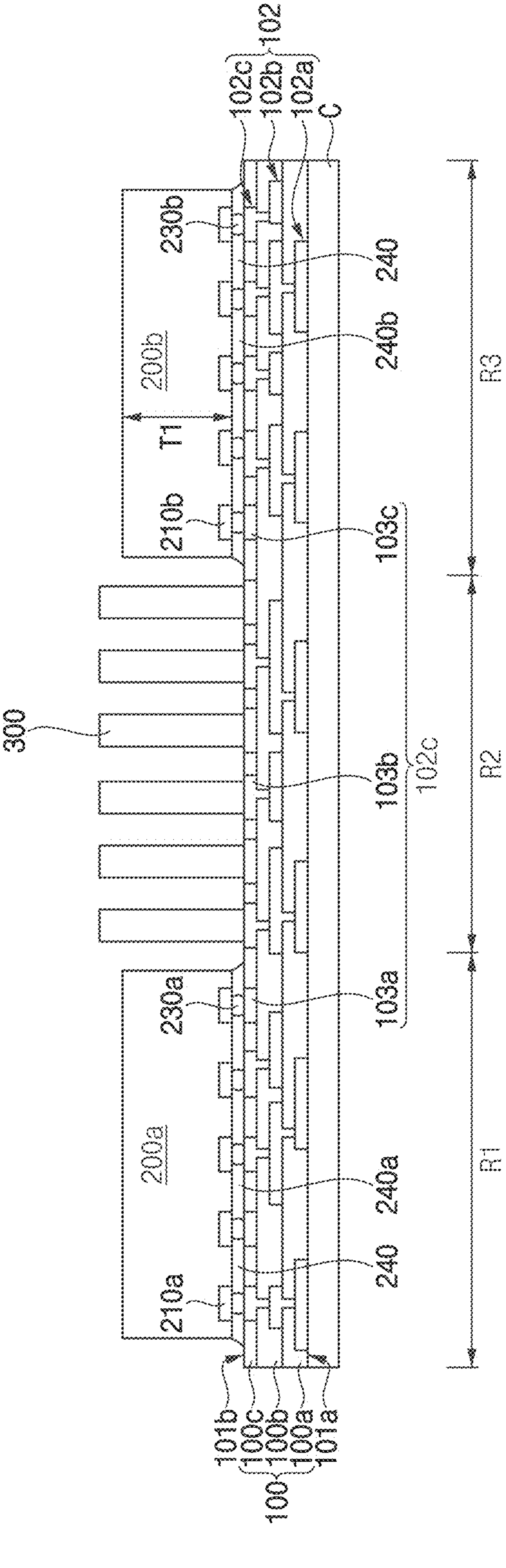
Figure 6:
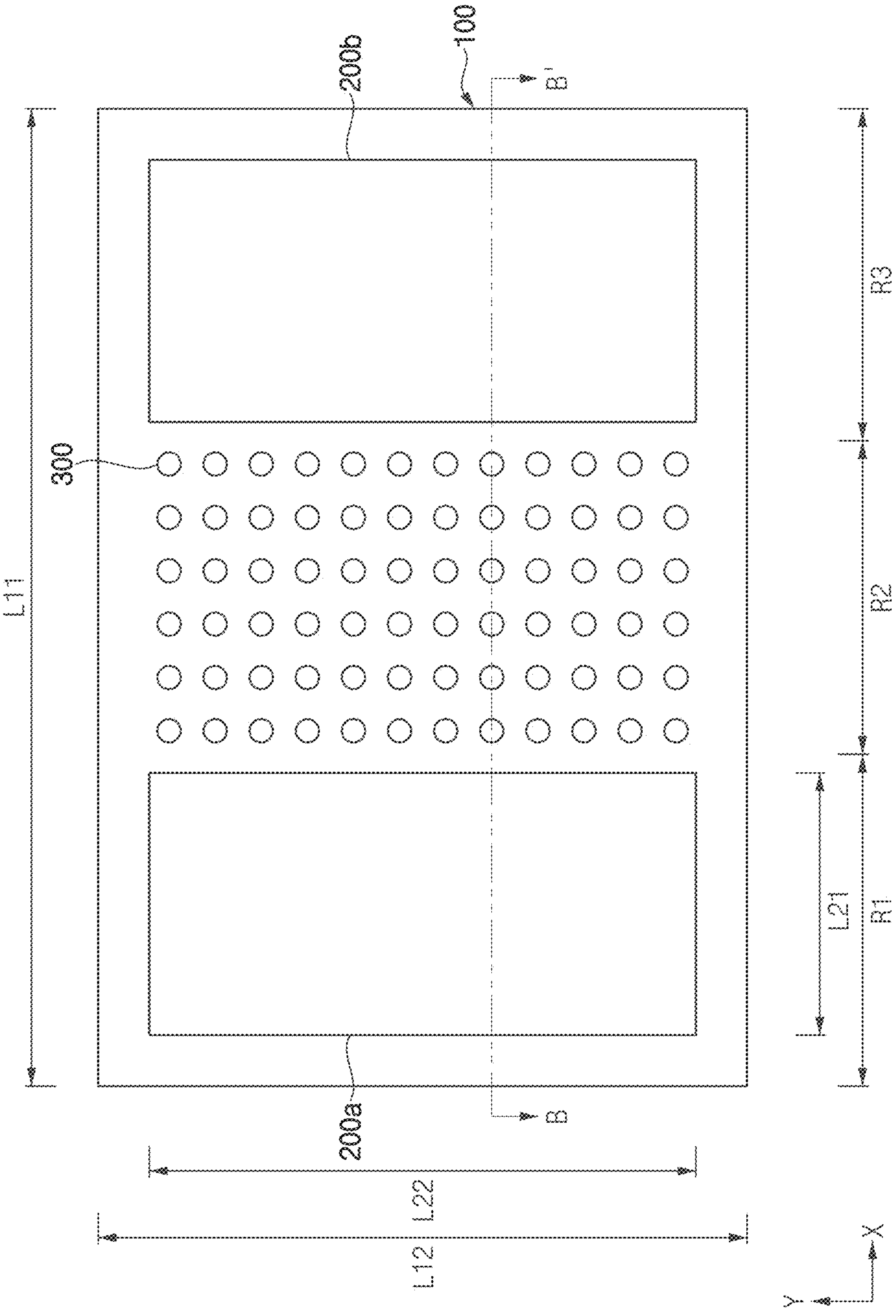

FIGS. 3 to 10 are views illustrating a method of manufacturing a semiconductor package in accordance with example embodiments. FIGS. 3 to 5 and 7 to 10 are cross-sectional views illustrating a method of manufacturing a semiconductor package in accordance with example embodiments. FIG. 6 is a plan view of FIG. 5. FIG. 5 is a cross-sectional view taken along the line C-C' in FIG. 6.

Referring to FIG. 3, a first redistribution wiring layer 100 having first redistribution wirings 102 may be formed on a carrier substrate C.

In some example embodiments, first lower redistribution wirings 102*a* may be formed on the carrier substrate C, and a first lower insulating layer 100*a* may be formed on the carrier substrate C to cover the first lower redistribution wirings 102*a*.

For example, the first lower redistribution wirings 102*a* may be formed by an electroplating process. After a seed layer is formed on the carrier substrate C, the seed layer may be patterned and the electroplating process may be performed to form the first lower redistribution wirings. The first lower redistribution wiring may include a conductive material, such as aluminum (Al), copper (Cu), tin (Sn), nickel (Ni), gold (Au), platinum (Pt), and/or an alloy thereof.

Although not illustrated in the figures, after bonding pads (for bonding with conductive bumps) are formed on the carrier substrate C, the first lower redistribution wirings may be formed on the bonding pads. Alternatively, as will be described below, after forming a first semiconductor chip, a second semiconductor chip and a second redistribution wiring layer on the first redistribution wiring layer 100, bonding pads such as UBM may be formed on redistribution pad portions of the first lower redistribution wirings.

The first lower insulating layer 100*a* may include a polymer and/or a dielectric layer. For example, the first lower insulating layer 100*a* may include polyimide (PI), lead oxide (PbO), polyhydroxystyrene (PHS), novolac, etc. The first lower insulating layer 100*a* may be formed by a vapor deposition process, a spin coating process, etc.

Then, after the first lower insulating layer 100*a* is patterned to form openings that expose the first lower redistribution wirings 102*a*, second lower redistribution wirings 102*b* may be formed on the first lower insulating layer 100*a* to be electrically connected to the first lower redistribution wirings 102*a* through the openings.

For example, a seed layer may be formed on a portion of the first lower insulating layer 100*a* and in the opening, the seed layer may be patterned, and an electroplating process may be performed to from the second lower redistribution wirings 102*b*. Accordingly, at least a portion of the second lower redistribution wiring 102*b* may directly contact the first lower redistribution wiring 102*a* through the opening.

Similarly, after a second lower insulating layer 100*b* is formed on the first lower insulating layer 100*a* to cover the second lower redistribution wirings 102*b*, the second lower insulating layer 100*b* may be patterned to form openings that expose the second lower redistribution wirings 102*b*. Then, third lower redistribution wirings 102*c* may be formed on the second lower insulating layer 100*b* to be electrically connected to the second lower redistribution wirings 102*b* through the openings.

Then, after a third lower insulating layer 100*c* is formed on the second lower insulating layer 100*b* to cover the third lower redistribution wirings 102*c*, the third lower insulating layer 100*c* may be patterned to form openings that expose the third lower redistribution wirings 102*c*. The third lower redistribution wirings 102*c* exposed by the opening may be uppermost redistribution wirings. A portion of the uppermost redistribution wiring may include a redistribution pad portion. Although not illustrated in the figures, a bump pad such as UBM may be formed on the redistribution pad portion.

Thus, the first redistribution wiring layer 100 having the first redistribution wirings 102 as a front redistribution wiring layer (FRDL) may be formed on the carrier substrate C. The first redistribution wiring layer 100 may include the stacked first, second and third lower insulating layers 100*a*, 100*b* and 100*c* and the first redistribution wirings 102 in the stacked first, second and third lower insulating layers 100*a*, 100*b* and 100*c*. The first redistribution wirings 102 may include the first, second and third lower redistribution wirings 102*a*, 102*b* and 102*c*. For example, a thickness of the first redistribution wiring layer 100 may be within a range of 5 μm to 50 μm.

The first redistribution wiring layer 100 may have a first surface 101*a* and a second surface 101*b* opposite to the first surface 101*a*. The first redistribution wiring layer 100 may include a first region R1, a second region R2 and a third region R3 arranged in a first direction. As will be described later, when viewed from a plan view, the first region R1 may be a first chip mounting region in which a first lower semiconductor chip is mounted on the second surface 101*b* of the first redistribution wiring layer 100, the third region R3 may be a second chip mounting region in which a second lower semiconductor chip is mounted on the second surface 101*b* of the first redistribution wiring layer 100, and the second region R2 may be a connector region between the first region R1 and the third region R3, in which a plurality of conductive vias are arranged on the second surface 101*b* of the first redistribution wiring layer 100.

The uppermost redistribution wirings 102*c* of the first redistribution wiring 102 may include first uppermost redistribution wirings 103*a* disposed in the first region R1 and electrically connected to first lower chip pads of the first lower semiconductor chip, second uppermost redistribution wirings 103*b* disposed in the second region R2 and electrically connected to the conductive vias, and third uppermost redistribution wirings 103*b* disposed in the third region R3 and electrically connected to second lower chip pads of the second lower semiconductor chip. Bump pads such as UBM may be formed on redistribution pad portions of the first to third uppermost redistribution wirings 103*a*, 103*b* and 103*c*.

Additionally, the first, second, and third uppermost redistribution wirings 103*a*, 103*b*, and 103*c* may be electrically connected to each other. Accordingly, the first lower semiconductor chip, the second lower semiconductor chip and the conductive vias may be electrically connected to each other.

The numbers, sizes, arrangements, etc. of the lower insulating layers and the lower redistribution wirings of the first redistribution wiring layer are provided as examples, and it will be understood that the present invention is not limited thereto.

Referring to FIG. 4, a plurality of conductive vias 300 may be formed on the second region R2 on the second surface 101*b* of the first redistribution wiring layer 100. The conductive vias 300 may be electrically connected to the first redistribution wirings 102 of the first redistribution wiring layer 100.

For example, a photoresist layer may be formed on the second surface 101*b* of the first redistribution wiring layer 100, and an exposure process may be performed on the photoresist layer to form a photoresist pattern having openings for forming the plurality of conductive vias on the second surface 101*b* of the second region R2 of the first redistribution wiring layer 100. The opening of the photoresist pattern may expose at least a portion of the second uppermost redistribution wiring 103*b* in the second region R2.

Then, an electroplating process may be performed to fill the openings of the photoresist pattern with a conductive material, to form the conductive vias 300. Then, the photoresist pattern may be removed by a strip process.

Thus, the conductive vias 300 may extend upward from the first redistribution wirings 102 (e.g., from the second uppermost redistribution wirings 103*b*). In some example embodiments, a diameter D1 of the conductive via 300 may be in a range of 30 μm to 100 μm, and a height H1 of the conductive via 300 may be in a range of 200 μm to 300 μm.

Referring to FIGS. 5 and 6, a first lower semiconductor chip 200*a* and a second lower semiconductor chip 200*b* may be disposed on the second surface 101*b* of the first redistribution wiring layer 100.

In some example embodiments, the first lower semiconductor chip 200*a* may be disposed in the first region R1 of the first redistribution wiring layer 100. The first lower semiconductor chip 200*a* may be mounted on the second surface 101*b* of the first redistribution wiring layer 100 by a flip chip bonding method. The first lower semiconductor chip 200*a* may be arranged such that a front surface on which first lower chip pads 210*a* are formed (e.g., such that an active surface of the first lower semiconductor chip 200*a* faces the first redistribution wiring layer 100). The first lower chip pads 210*a* of the first lower semiconductor chip 200*a* may be electrically connected to the first redistribution wirings 102 of the first redistribution wiring layer 100 (e.g., the first uppermost redistribution wirings 103*a* by first conductive bumps 230*a*).

Similarly to the first lower semiconductor chip, the second lower semiconductor chip 200*b* may be disposed in the third region R3 of the first redistribution wiring layer 100. The second lower semiconductor chip 200*b* may be mounted on the second surface 101*b* of the first redistribution wiring layer 100 by a flip chip bonding method. The second lower semiconductor chip 200*b* may be arranged such that a front surface on which second lower chip pads 210*b* are formed (e.g., such that an active surface of the second lower semiconductor chip 200*b* faces the first redistribution wiring layer 100). The second lower chip pads 210*b* of the second lower semiconductor chip 200*b* may be electrically connected to the first redistribution wirings 102 of the first redistribution wiring layer 100 (e.g., to the third uppermost redistribution wirings 103*c*) by second conductive bumps 230*b*.

In at least some embodiments, the first lower semiconductor chip and the second lower semiconductor chip may be logic chips including logic circuits. The logic chip may be a controller configured to control memory chips. The first lower semiconductor chip and the second lower semiconductor chips may be ASICs serving as hosts such as CPUs, NPUs, GPUs, and SOCs, and processor chips such as application processors (APs). For example, the first lower semiconductor chip and the second lower semiconductor chip may include IP blocks. In case of a mobile AP, IP blocks such as CPU, GPU, NPU, Modem, etc., may be divided into at least one of the first lower semiconductor chip and the second lower semiconductor chip and mounted thereon.

For example, the first and second conductive bumps 230*a* and 230*b* may include uBumps. The first and second conductive bumps 230*a* and 230*b* may have a diameter in a range of 30 μm to 120 μm. The first and second conductive bumps may include a pillar portion formed on the lower chip pad and a solder portion formed on the pillar portion.

First and second underfill members 240*a* and 240*b* may be disposed between the first lower semiconductor chip 200*a* and the first redistribution wiring layer 100 and between the second lower semiconductor chip 200*b* and the first redistribution wiring layer 100. The first and second underfill members may include a material having relatively high fluidity, during deposition, to effectively fill small spaces between the first lower semiconductor chip and the first redistribution wiring layer and between the second lower semiconductor chip and the first redistribution wiring layer. For example, the first and second underfill members may include an adhesive containing an epoxy material.

As illustrated in FIG. 6, the first redistribution wiring layer 100 may have a rectangular shape extending in one direction. For example, the first redistribution wiring layer 100 may have a long side L11 in a first direction (X direction) and a short side L12 in a second direction (Y direction) perpendicular to the first direction.

For example, the first lower semiconductor chip 200*a* and the second lower semiconductor chip 200*b* may have a first height from the second surface 101*b* of the first redistribution wiring layer 100, and the plurality of conductive vias 300 may have a second height greater than or equal to the first height from the second surface 101*b* of the first redistribution wiring layer 100. For example, thicknesses of the first lower semiconductor chip 200*a* and the second lower semiconductor chip 200*b* may be within a range of 100 μm to 300 μm.

The lengths of the short side and the long side of the first redistribution wiring layer, the lengths of the short side and long sides and the heights of the first lower semiconductor chip and the second lower semiconductor chip, the arrangement of the conductive vias, etc. are provided as examples, and it will be understood that the present invention is not limited thereto. The lengths of the short side and the long side of the first redistribution wiring layer, the lengths of the short side and long sides and the heights of the first lower semiconductor chip and the second lower semiconductor chip, the arrangement of the conductive vias, etc. may be determined in consideration of the thickness, warpage, and heat dissipation characteristics of the entire package.

Figure 7:
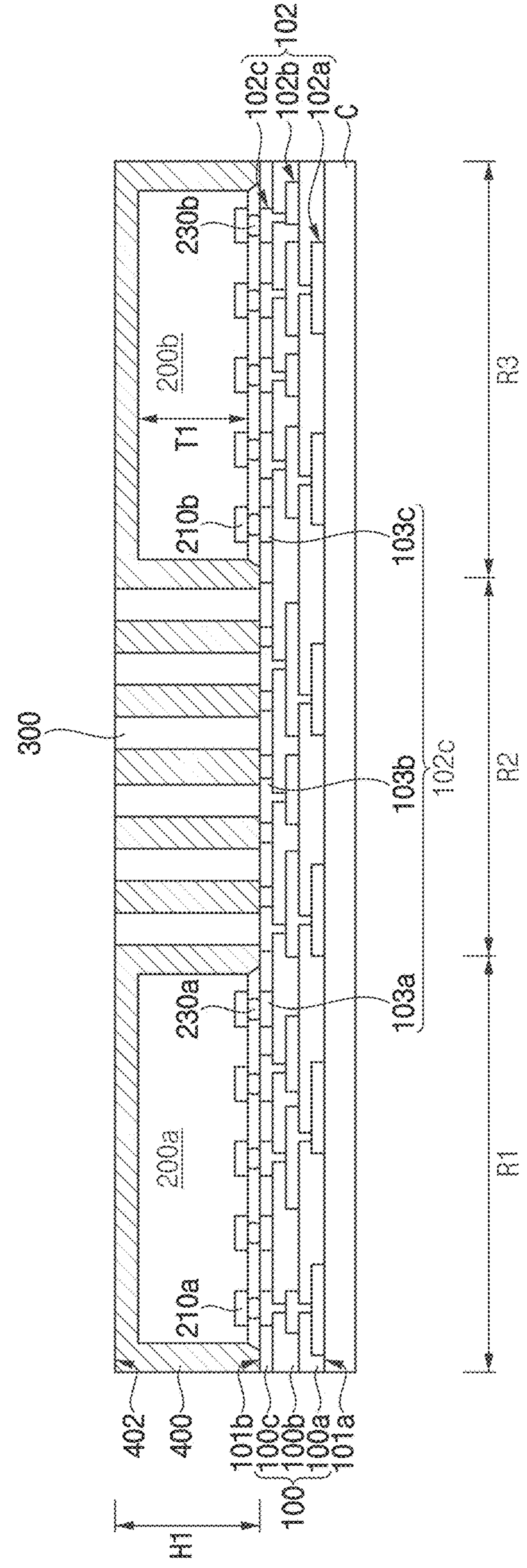

Referring to FIG. 7, a sealing member 400 may be formed on the second surface 101*b* of the first redistribution wiring layer 100 to cover the first lower semiconductor chip 200*a*, the second lower semiconductor chip 200*b* and the conductive vias 300.

For example, the sealing member 400 may include an epoxy molding compound (EMC) such as at least one of UV resin, polyurethane resin, silicone resin, silica filler, etc.

In some example embodiments, a sealing material may be formed on the second surface 101*b* of the first redistribution wiring layer 100 to cover upper surfaces of the first lower semiconductor chip 200*a*, the second lower semiconductor chip 200*b* and the conductive vias 300, and then, an upper portion of the sealing material may be partially removed to expose upper surfaces of the conductive vias 300.

Accordingly, the first lower semiconductor chip 200*a* and the second lower semiconductor chip 200*b* may be covered by the sealing member 400, and the conductive vias 300 may be exposed by an upper surface 402 of the sealing member 400.

Figure 8:
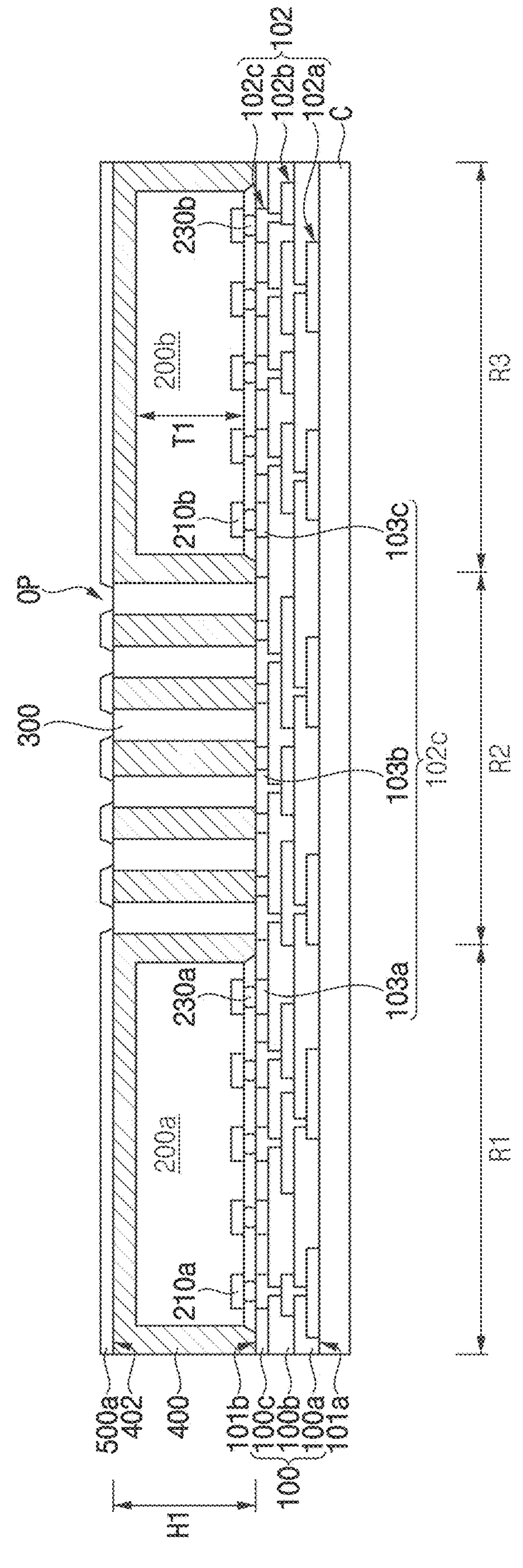
Figure 9:
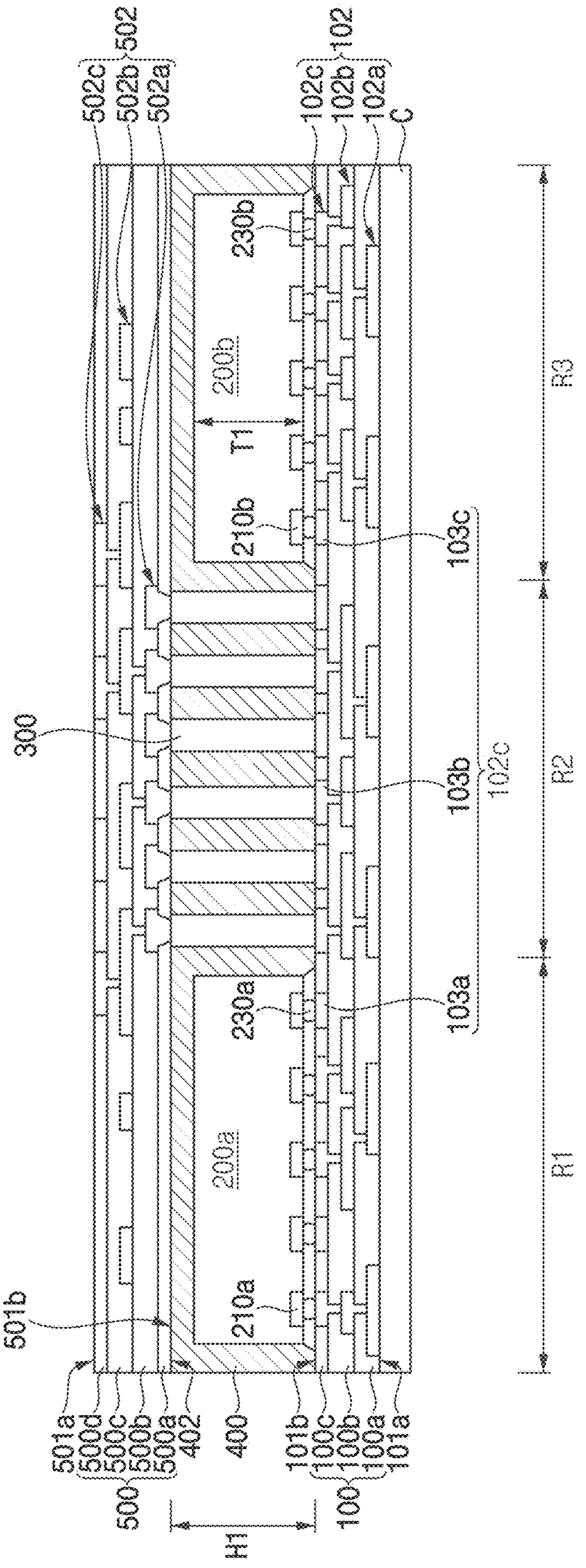

Referring to FIGS. 8 and 9, a second redistribution wiring layer 500 having second redistribution wirings 502 may be formed on the upper surface 402 of the sealing member 400. The second redistribution wirings 502 may be electrically connected to the conductive vias 300. The second redistribution wiring layer 300 may be disposed on the first lower semiconductor chip 200*a* and the second lower semiconductor chip 200*b*. The second redistribution wiring layer 500 may be arranged to overlap the conductive vias 300.

As illustrated in FIG. 8, after a first upper insulating layer 500*a* may be formed on the upper surface 402 of the sealing member 400, the first upper insulation layer 500*a* may be patterned to form openings OP that expose the conductive vias respectively. The openings of the patterned first upper insulation layer 500*a* may expose the upper surfaces of the conductive vias 300. The first upper insulating layer 500*a* may include a polymer or a dielectric layer. The first upper insulating layer 500*a* may be formed by a vapor deposition process, a spin coating process, etc.

As illustrated in FIG. 9, after a seed layer is formed on portions of the conductive vias 300 and in the openings, the seed layer may be patterned and an electroplating process may be performed to form first upper redistribution wirings 502*a*. Accordingly, at least portions of the first upper redistribution wirings 502*b* may directly contact the conductive vias 300 through the opening. The first upper redistribution wirings may include a conductive material, such as aluminum (Al), copper (Cu), tin (Sn), nickel (Ni), gold (Au), platinum (Pt), and/or an alloy thereof.

Similarly, after a second upper insulating layer 500*b* is formed on the first upper insulating layer 500*a*, the second upper insulating layer 500*b* may be patterned to form openings that expose the first upper redistribution wirings 502*a*. Then, second upper redistribution wirings 502*b* may be formed on the second upper insulating layer 500*a* to be electrically connected to the first upper redistribution wirings 502*a* through the openings.

Then, after a third upper insulating layer 500*c* is formed on the second upper insulating layer 500*b*, the third upper insulating layer 500*c* may be patterned to form openings that expose the second upper redistribution wirings 502*b*. Then, third upper redistribution wirings 502*c* may be formed on the third upper insulating layer 500*c* to be electrically connected to the second upper redistribution wirings 502*b* through the openings. The third upper redistribution wirings 502*c* may be uppermost redistribution wirings. A portion of the uppermost redistribution wiring may include a redistribution pad portion.

Then, a bonding pad such as a UBM may be formed on the redistribution pad portion, a fourth upper insulating layer 500*d* exposing at least a portion of the bonding pad may be formed on the third upper insulating layer 500*c*. The fourth upper insulating layer 500*d* may serve as a passivation layer.

Thus, the second redistribution wiring layer 500 having the second redistribution wiring layers 502 as a backside redistribution wiring layer (BRDL) may be formed on the sealing member 400. The second redistribution wiring layer 500 may include the first, second and third upper insulating layers 500*a*, 500*b* and 500*c* stacked on one another and the second redistribution wirings 502 in the stacked first, second and third upper insulating layers 600*a*, 600*b* and 600*c*. The second redistribution wirings 502 may include the first, second and third upper redistribution wirings 502*a*, 502*b* and 502*c*. The second redistribution wiring layer 500 may have a first surface and a second surface 501*a* opposite to the first surface.

The numbers, sizes, arrangements, etc., of the upper insulating layers and the upper redistribution wirings of the second redistribution wiring layer are provided as examples, and it will be understood that the present invention is not limited thereto.

Figure 10:
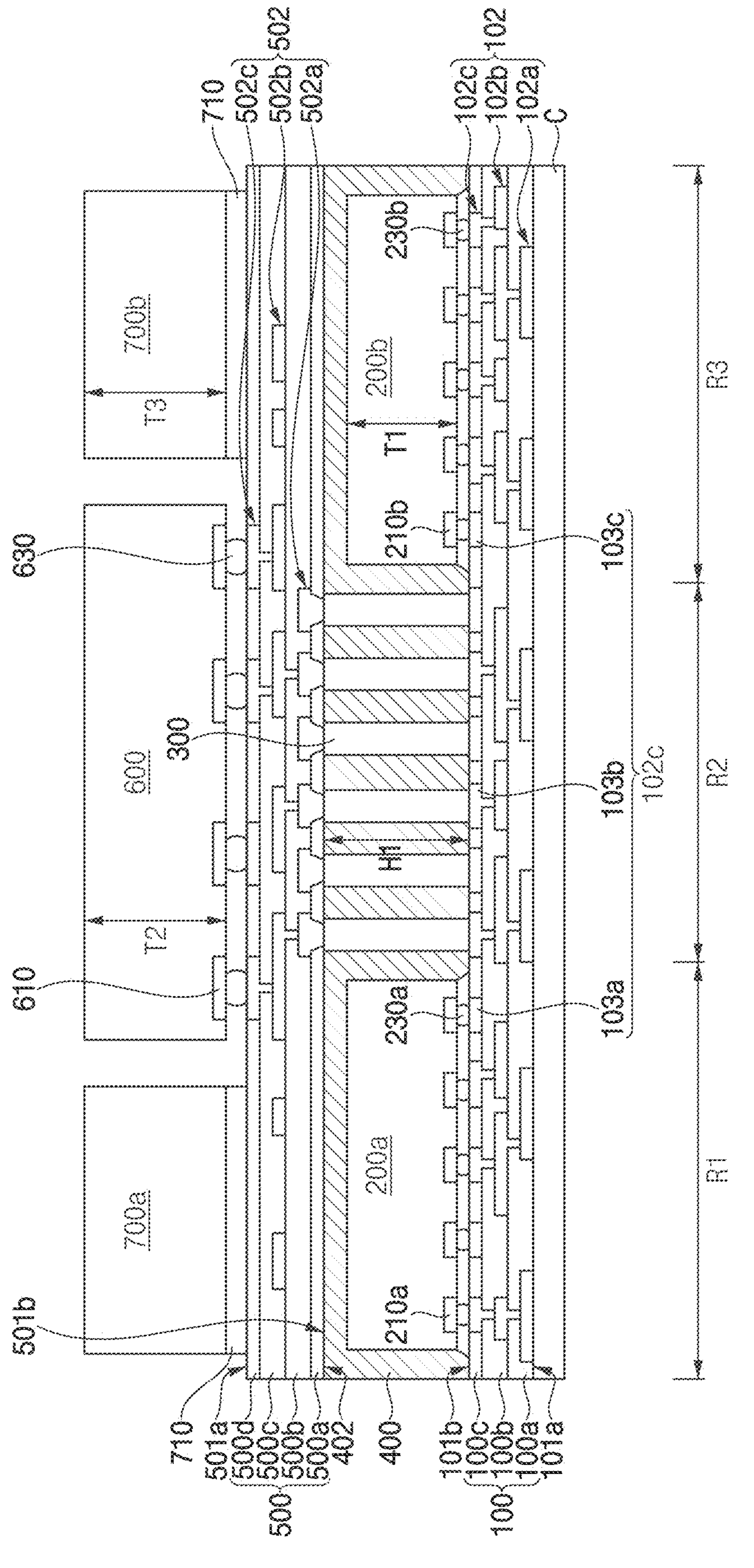

Referring to FIG. 10, an upper semiconductor chip 600 as an upper package, a first heat dissipation block 700*a* and a second heat dissipation block 700*b* may be stacked on the second redistribution wiring layer 500 of a lower package of FIG. 9.

In some example embodiments, the upper semiconductor chip 600 may be mounted on a second surface 501*a* of the second redistribution wiring layer 500 by a flip chip bonding method. The upper semiconductor chip 600 may be arranged such that a front surface on which upper chip pads 610 are formed, that is, an active surface faces the second redistribution wiring layer 500. The upper chip pads 610 of the upper semiconductor chip 600 may be electrically connected to the second redistribution wirings 502 of the second redistribution wiring layer 500 by third conductive bumps 630.

The upper semiconductor chip 600 may be disposed to at least partially overlap the plurality of conductive vias 300. The upper semiconductor chip 600 may include a memory chip. The memory chip may include various types of memory circuits, such as DRAM, SRAM, flash, PRAM, ReRAM, FeRAM, or MRAM.

Although one upper semiconductor chip is illustrated as being mounted on the second redistribution wiring layer 500, it is not limited thereto, and for example, the upper package may include a package substrate and at least one upper semiconductor chip mounted on the package substrate, and the package substrate of the upper package may be mounted on the second redistribution wiring layer via the third conductive bumps.

Then, the first heat dissipation block 700*a* and the second heat dissipation block 700*b* may be disposed on the second redistribution wiring layer 500. The first heat dissipation block 700*a* and the second heat dissipation block 700*b* may be arranged in both sides of the upper semiconductor chip 600 on the second redistribution wiring layer 500.

The first heat dissipation block 700*a* may be disposed on the first lower semiconductor chip 200*a*, and the second heat dissipation block 700*b* may be disposed on the second lower semiconductor chip 200*b*. The first heat dissipation block 700*a* may be arranged to partially overlap the first lower semiconductor chip 200*a*, and the second heat dissipation block 700*b* may be arranged to partially overlap the second lower semiconductor chip 200*b*.

The first heat dissipation block 700*a* and the second heat dissipation block 700*b* may be attached to the second surface 501*a* of the second redistribution wiring layer 500 by an adhesive film 710 such as a non-conductive adhesive film (NCF).

For example, the first heat dissipation block 700*a* and the second heat dissipation block 700*b* may include a material having excellent thermal conductivity. Heights of the first heat dissipation block 700*a* and the second heat dissipation block 700*b* from the second redistribution wiring layer 500 may be the same as a height of the upper semiconductor chip 600 from the second redistribution wiring layer 500.

Then, external connection members 800 (see FIG. 1) may be formed on the first surface 101*a* of the first redistribution wiring layer 100. The external connection members such as solder balls or solder bumps may be respectively formed on bonding pads on the redistribution pad portions of the first lower redistribution wirings 102*a* of the first redistribution wiring layer 100.

Figure 11:
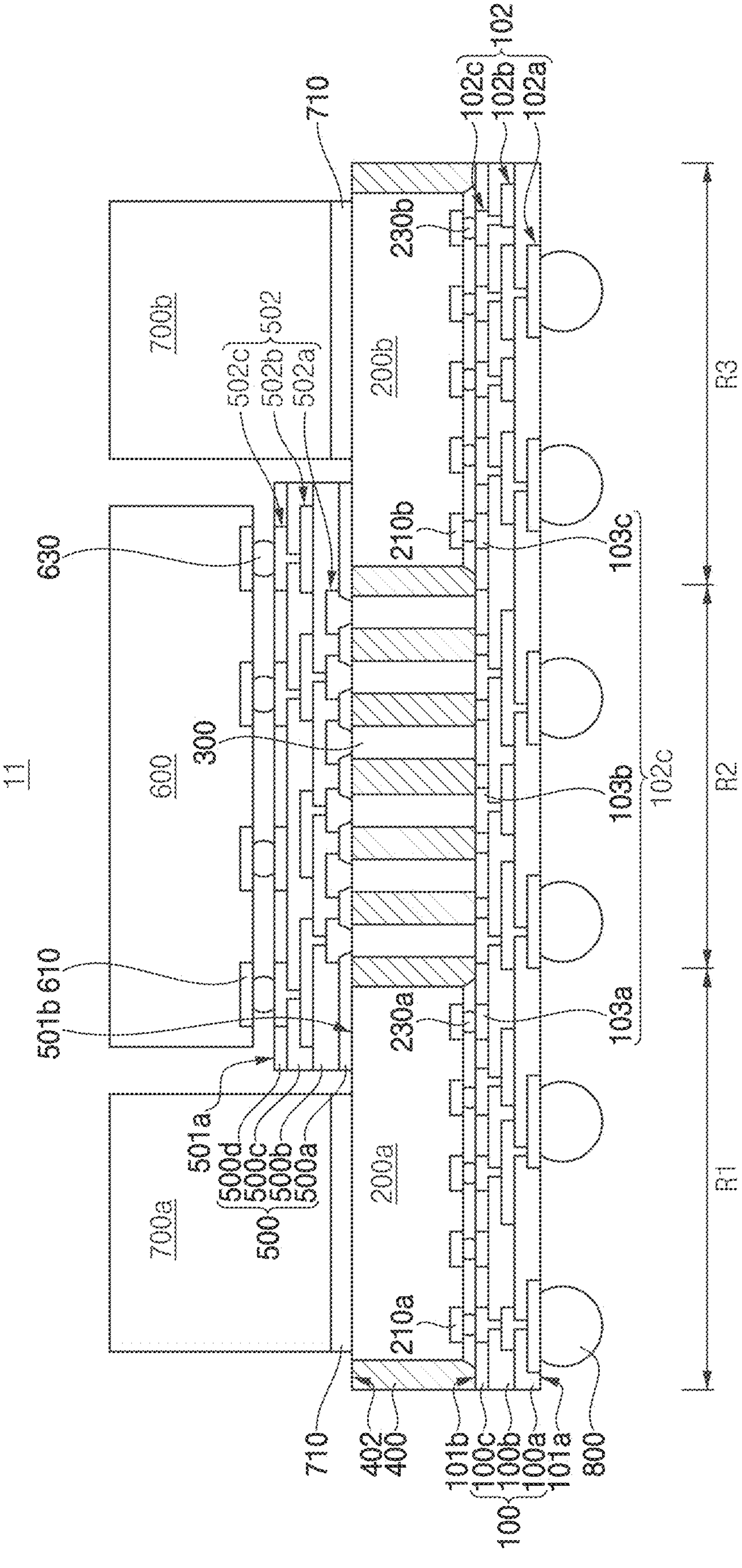
Figure 12:
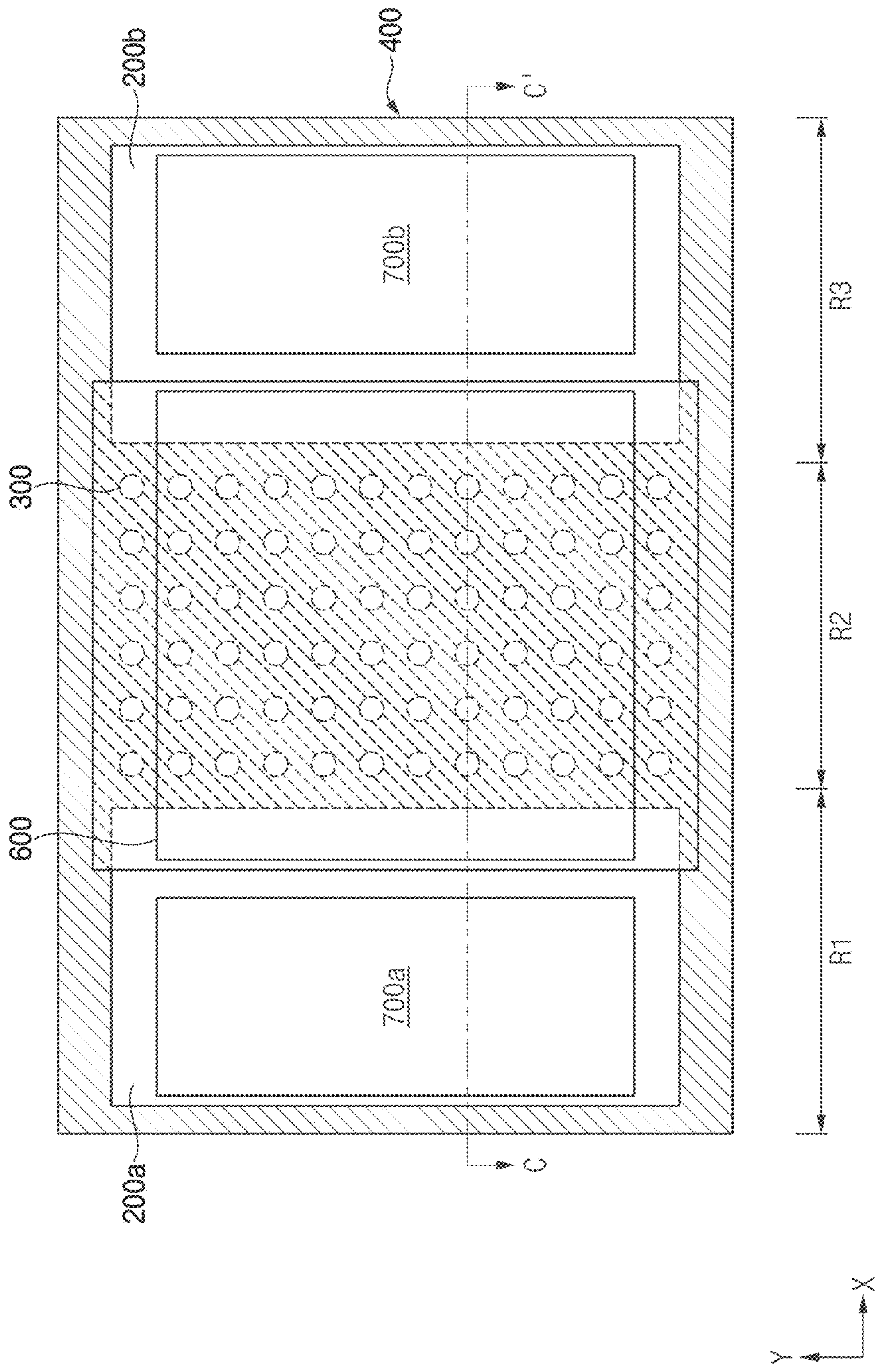

FIG. 11 is a cross-sectional view illustrating a semiconductor package in accordance with example embodiments. FIG. 12 is a plan view illustrating the semiconductor package in FIG. 11. The semiconductor package may be substantially the same as the semiconductor package described with reference to FIGS. 1 to 3 except for arrangements of a second redistribution wiring layer, a first heat dissipation block and a second heat dissipation block. Thus, same reference numerals may be used to refer to the same or like elements and further repetitive explanations concerning the above elements may be omitted.

Referring to FIGS. 11 and 12, a semiconductor package 11 may include a first redistribution wiring layer 100, a first lower semiconductor chip 200*a*, a second lower semiconductor chip 200*b*, a plurality of conductive vias 300, a sealing member 400 and a second redistribution wiring layer 500, an upper semiconductor chip 600, a first heat dissipation block 700*a* and a second heat dissipation block 700*b*. In addition, the semiconductor package 11 may further include external connection members 800.

In some example embodiments, the sealing member 400 may expose upper surfaces of the first lower semiconductor chip 200*a*, the second lower semiconductor chip 200*b*, and the conductive vias 300. Heights of the first lower semiconductor chip 200*a* and the second lower semiconductor chip 200*b* from a second surface 101*b* of the first redistribution wiring layer 100 may be the same as heights of the plurality of conductive vias 300 from the second surface 101*b* of the first redistribution wiring layer 100.

Accordingly, the first lower semiconductor chip 200*a*, the second lower semiconductor chip 200*b*, and the conductive vias 300 may be exposed by an upper surface 402 of the sealing member 400.

In some example embodiments, the second redistribution wiring layer 500 may be disposed on a second region R2 on the second surface 101*b* of the first redistribution wiring layer 100 to cover the conductive vias 300. The second redistribution wiring layer 500 may be disposed to expose at least portions of the first lower semiconductor chip 200*a* and the second lower semiconductor chip 200*b*.

The first heat dissipation block 700*a* may be disposed directly on the upper surface of the first lower semiconductor chip 200*a* exposed by the sealing member 400 and the second redistribution wiring layer 500, and the second heat dissipation block 700*b* may be disposed directly on the upper surface of the second lower semiconductor chip 200*b* exposed by the sealing member 400 and the second redistribution wiring layer 500.

The first heat dissipation block 700*a* may be attached to the upper surface of the first lower semiconductor chip 200*a* by an adhesive film 710 such as a non-conductive adhesive film (NCF). The second heat dissipation block 700*b* may be attached to the upper surface of the second lower semiconductor chip 200*b* by an adhesive film 710 such as a non-conductive adhesive film (NCF).

As mentioned above, the upper surfaces of the first lower semiconductor chip 200*a* and the second lower semiconductor chip 200*b* may be exposed by the sealing member 400 and the second redistribution wiring layer 500, and the first heat dissipation block 700*a* and the second heat dissipation block 700*b* may be respectively disposed on the upper surface of the first lower semiconductor chip 200*a* and the upper surface of the second lower semiconductor chip 200*b* exposed by the sealing member 400 and the second redistribution wiring layer 500.

Accordingly, heat dissipation characteristics from the first lower semiconductor chip 200*a* and the second lower semiconductor chip 200*b* may be greatly improved by the first heat dissipation block 700*a* and the second heat dissipation block 700*b*.

Hereinafter, a method of manufacturing the semiconductor package of FIG. 11 will be described.

Figure 13:
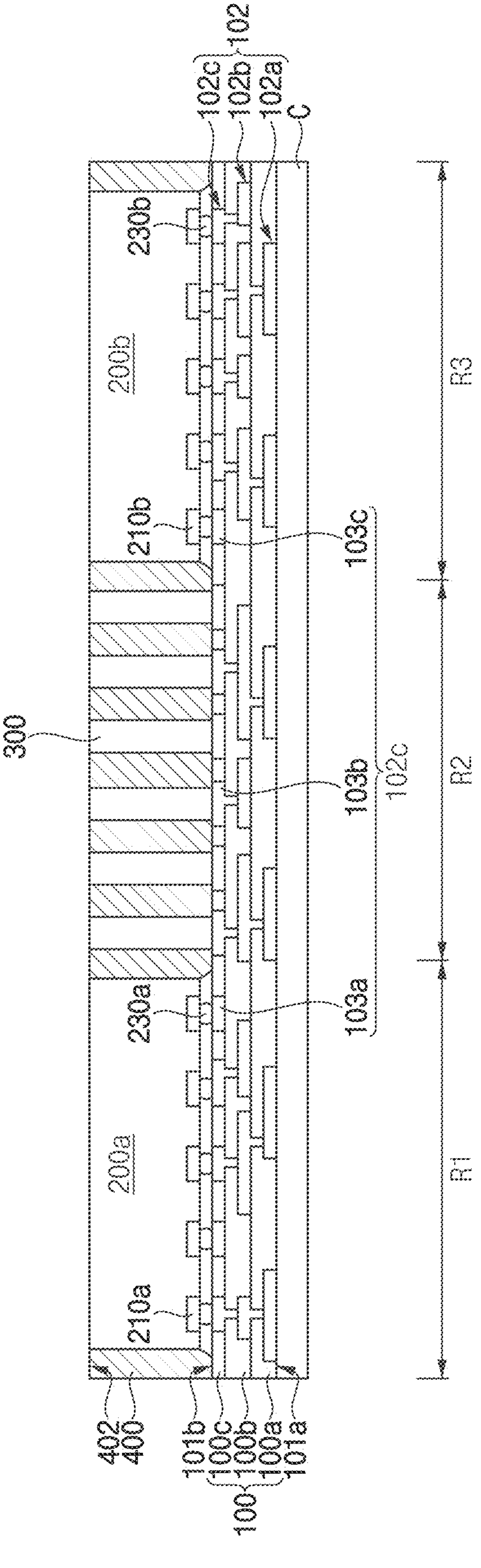
Figure 14:
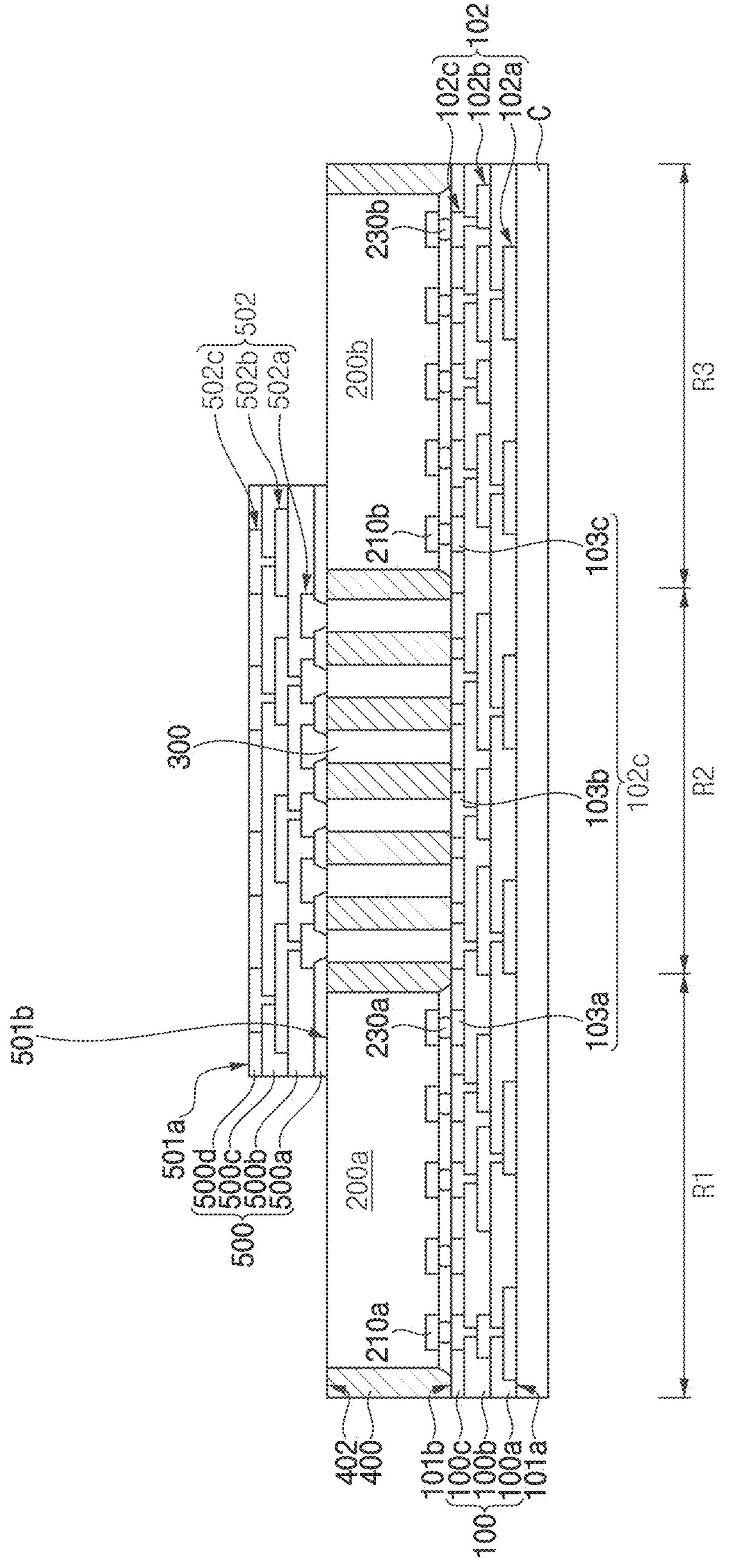
Figure 15:
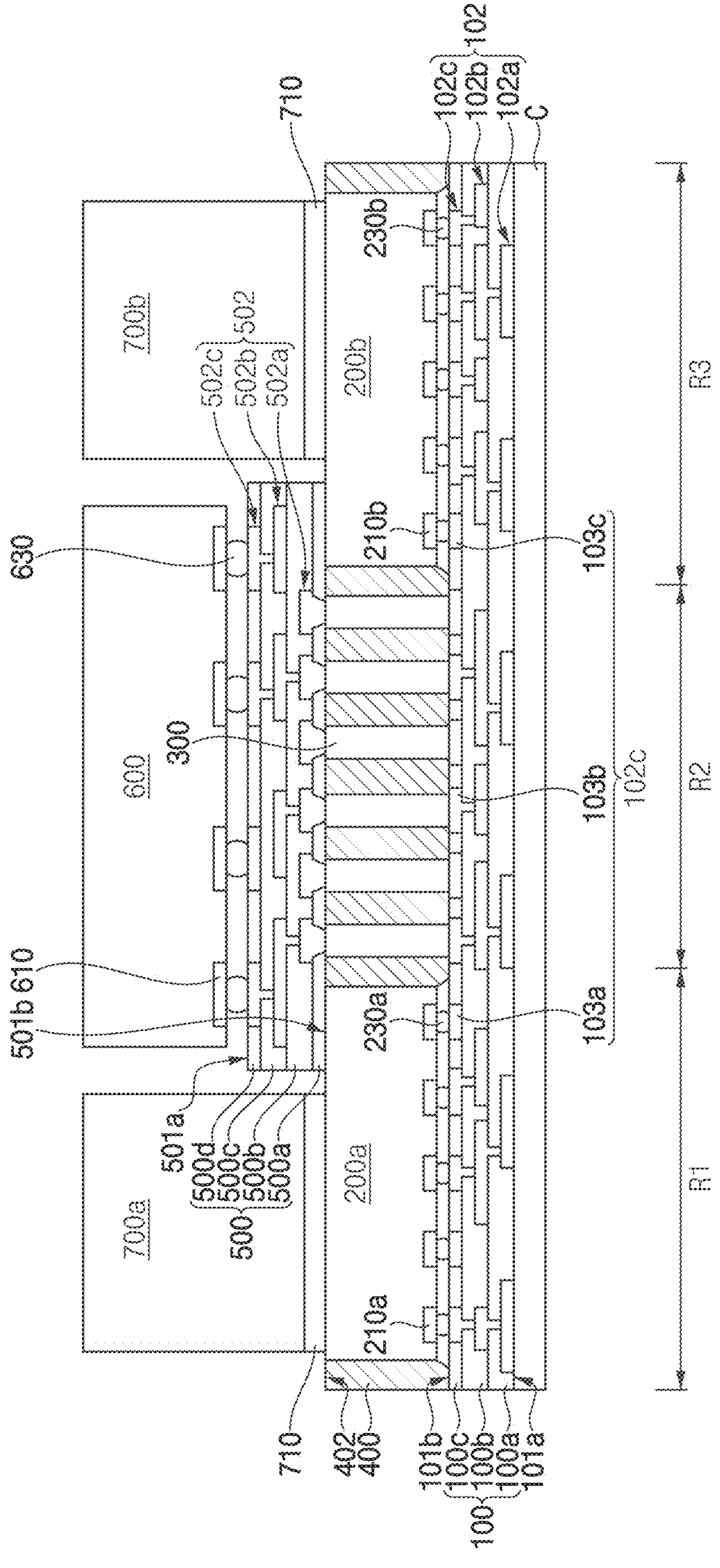

FIGS. 13 to 15 are cross-sectional views illustrating a method of manufacturing a semiconductor package in accordance with example embodiments.

Referring to FIG. 13, first, processes the same as or similar to the processes described with reference to FIGS. 3 to 5 may be performed to form a first redistribution wiring layer 100 having first redistribution wirings 102, a plurality of conductive vias 300 may be formed on a connector region R2 on a second surface 101*b* of the first redistribution wiring layer 100, and a first lower semiconductor chip 200*a* and a second lower semiconductor chip 200*b* may be mounted on a first region R1 and a third region R3 on the second surface 101*b* of the first redistribution wiring layer 100 respectively. Then, a sealing member 400 may be formed on the second surface 101*b* of the first redistribution wiring layer 100 to cover the first lower semiconductor chip 200*a*, the second lower semiconductor chip 200*b* and the conductive vias 300.

In some example embodiments, heights of the first lower semiconductor chip 200*a* and the second lower semiconductor chip 200*b* from the second surface 101*b* of the first redistribution wiring layer 100 may be the same as heights of the plurality of conductive vias 300 from the second surface 101*b* of the first redistribution wiring layer 100.

After a sealing material is formed on the second surface 101*b* of the first redistribution wiring layer 100 to cover the first lower semiconductor chip 200*a*, the second lower semiconductor chip 200*b*, and the conductive vias 300, an upper portion of the sealing material may be removed to expose upper surfaces of the first lower semiconductor chip 200*a*, the second lower semiconductor chip 200*b* and the conductive vias 300.

Accordingly, the first lower semiconductor chip 200*a*, the second lower semiconductor chip 200*b* and the conductive vias 300 may be exposed by an upper surface 402 of the sealing member 400.

Referring to FIG. 14, processes the same as or similar to the processes described with reference to FIGS. 8 and 9 may be performed to form a second redistribution wiring layer 500 having second redistribution wirings 502 on the upper surface 402 of the sealing member 400. The second redistribution wirings 502 may be electrically connected to the conductive vias 40.

In example embodiments, the second redistribution wiring layer 500 may be disposed on the second region R2 on the second surface 101*b* of the first redistribution wiring layer 100 to cover the conductive vias 300. The second redistribution wiring layer 500 may be disposed to expose at least portions of the first lower semiconductor chip 200*a* and the second lower semiconductor chip 200*b*. In at least some embodiments, a mask may be used to prevent the formation of the second redistribution wiring layer 500 over at least a portion of the first and third regions R1 and R3, and/or the second redistribution wiring layer 500 over at least the portions of the first and third regions R1 and R3 may be removed.

Referring to FIG. 15, processes the same as or similar to the processes described with reference to FIG. 10 may be performed to stack an upper semiconductor chip 600 as an upper package on the second redistribution wiring layer 500. Then, a first heat dissipation block 700*a* and a second heat dissipation block 700*b* may be disposed on the first lower semiconductor chip 200*a* and the second lower semiconductor chip 200*b*, respectively.

In some example embodiments, the upper semiconductor chip 600 may be mounted on an upper surface 501*a* of the second redistribution wiring layer 500 by a flip chip bonding method. The upper semiconductor chip 600 may be arranged so that a front surface on which upper chip pads 610 are formed, that is, an active surface faces the second redistribution wiring layer 600. The upper chip pads 610 of the upper semiconductor chip 600 may be electrically connected to the second redistribution wirings 502 of the second redistribution wiring layer 500 by third conductive bumps 630.

The first heat dissipation block 700*a* may be disposed on the upper surface of the first lower semiconductor chip 200*a* exposed by the sealing member 400 and the second redistribution wiring layer 500, and the second heat dissipation block 700*b* may be disposed on the upper surface of the second lower semiconductor chip 200*b* exposed by the sealing member 400 and the second redistribution wiring layer 500.

The first heat dissipation block 700*a* may be attached to the upper surface of the first lower semiconductor chip 200*a* by an adhesive film 710 such as a non-conductive adhesive film (NCF). The second heat dissipation block 700*b* may be attached to the upper surface of the second lower semiconductor chip 200*b* by an adhesive film 710 such as a non-conductive adhesive film (NCF).

Then, external connection members 800 (see to FIG. 11) may be formed on a first surface 101*a* of the first redistribution wiring layer 100 to complete the semiconductor package 11 of FIG. 11.

Figure 16:
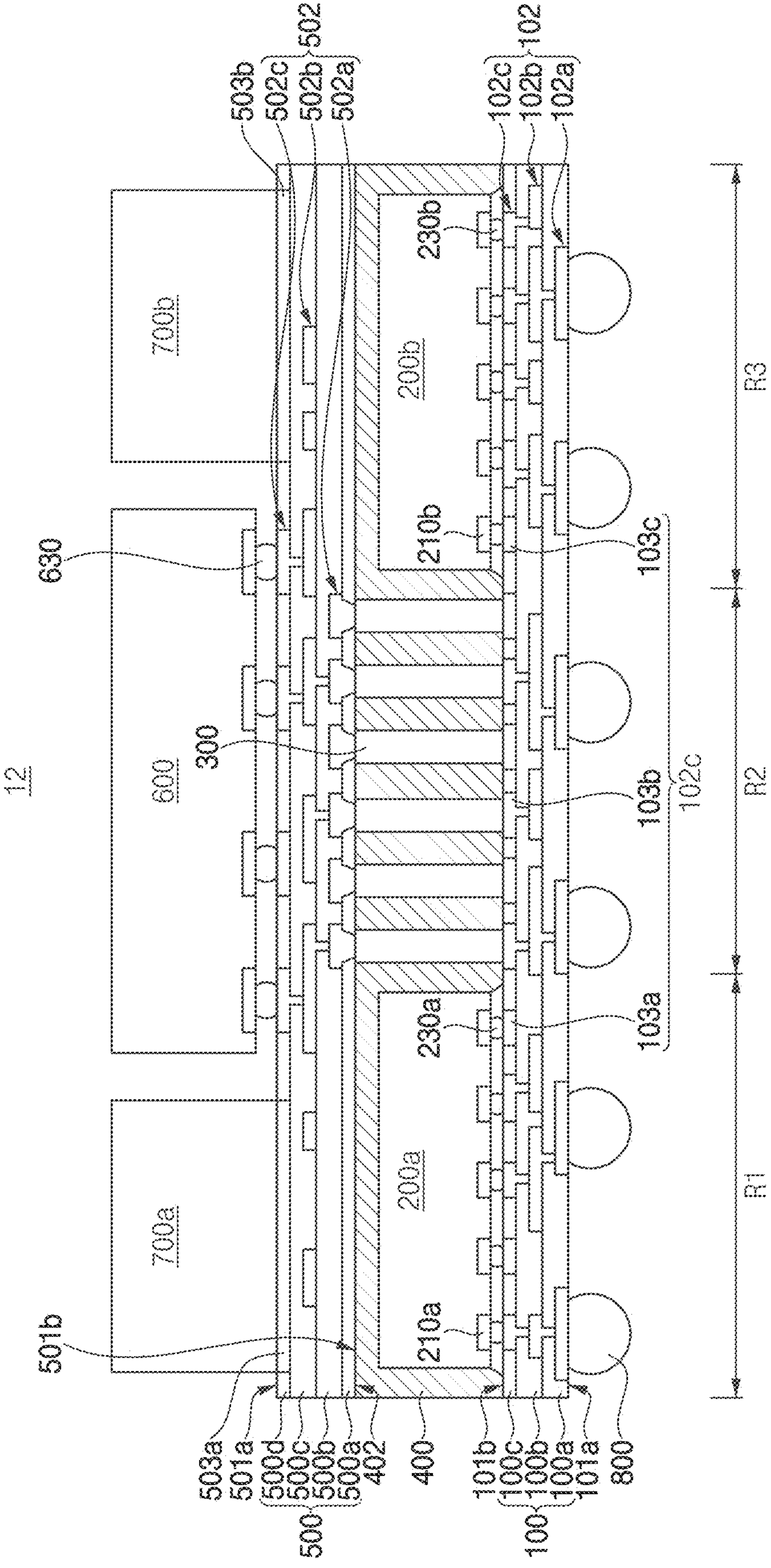

FIG. 16 is a cross-sectional view illustrating a semiconductor package in accordance with some example embodiments. The semiconductor package may be substantially the same as the semiconductor package described with reference to FIGS. 1 and 2 except for a configuration of a second redistribution wiring layer. Thus, same reference numerals may be used to refer to the same or like elements and further repetitive explanations concerning the above elements may be omitted.

Referring to FIG. 16, a semiconductor package 12 may include a first redistribution wiring layer 100, a first lower semiconductor chip 200*a*, a second lower semiconductor chip 200*b*, a plurality of conductive vias 300, a sealing member 400 and a second redistribution wiring layer 500, an upper semiconductor chip 600, a first heat dissipation block 700*a* and a second heat dissipation block 700*b*. In addition, the semiconductor package 11 may further include external connection members 800.

In some example embodiments, the second redistribution wiring layer 500 may further include a first heat dissipation pad 503*a* and a second heat dissipation pad 503*b*. The first heat dissipation pad 503*a* and the second heat dissipation pad 503*b* may be exposed from an upper surface 501*b* of the second redistribution wiring layer 500. The first heat dissipation pad 503*a* and the second heat dissipation pad 503*b* may be provided on the same plane as the uppermost redistribution wirings, that is, the third upper redistribution wirings 602*c*. The first heat dissipation pad 503*a* may have the same planar area as a lower surface of the first heat dissipation block 700*a*. The second heat dissipation pad 503*b* may have the same planar area as a lower surface of the second heat dissipation block 700*b*.

The first heat dissipation block 700*a* may be disposed on the first heat dissipation pad 503*a*, and the second heat dissipation block 700*b* may be disposed on the second heat dissipation pad 503*b*. The first heat dissipation block 700*a* may be attached to the first heat dissipation pad 503*a* by an adhesive film such as a non-conductive adhesive film (NCF). The second heat dissipation block 700*b* may be attached to the upper surface of the second heat dissipation pad 503*b* by an adhesive film such as a non-conductive adhesive film (NCF).

Accordingly, heat dissipation characteristics from the first lower semiconductor chip 200*a* and the second lower semiconductor chip 200*b* may be greatly improved by the first heat dissipation block 700*a* and the second heat dissipation block 700*b*.

The semiconductor package may include semiconductor devices such as logic devices or memory devices. The semiconductor package may include logic devices such as central processing units (CPUs), main processing units (MPUs), or application processors (APs), and/or the like, and volatile memory devices such as DRAM devices, high bandwidth memory (HBM) devices, or non-volatile memory devices such as flash memory devices, PRAM devices, MRAM devices, ReRAM devices, or the like.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present invention. Accordingly, all such modifications are intended to be included within the scope of example embodiments as defined in the claims.

What is claimed is:

1. A semiconductor package, comprising:

a first redistribution wiring layer including first redistribution wirings;

a first lower semiconductor chip and a second lower semiconductor chip on the first redistribution wiring layer such that the first lower semiconductor chip and the second lower semiconductor chip are spaced apart from each other and are electrically connected to the first redistribution wirings;

a sealing member on the first redistribution wiring layer and covering at least a portion of the first lower semiconductor chip and the second lower semiconductor chip;

a second redistribution wiring layer on the sealing member and including second redistribution wirings;

a plurality of conductive vias between the first lower semiconductor chip and the second lower semiconductor chip and penetrating the sealing member such that the plurality of conductive vias electrically connect the first redistribution wirings to the second redistribution wirings;

an upper semiconductor chip on the second redistribution wiring layer such that the upper semiconductor chip is electrically connected to the second redistribution wirings;

a first heat dissipation block on the first lower semiconductor chip; and a second heat dissipation block on the second lower semiconductor chip.

2. The semiconductor package of claim 1, wherein the first lower semiconductor chip and the second lower semiconductor chip include lower chip pads facing the first redistribution wiring layer.

3. The semiconductor package of claim 2, wherein the first lower semiconductor chip and the second lower semiconductor chip are mounted to the first redistribution wiring layer with first conductive bumps on the lower chip pads.

4. The semiconductor package of claim 1, wherein the second redistribution wiring layer overlaps the plurality of conductive vias.

5. The semiconductor package of claim 1, the first heat dissipation block and the second heat dissipation block are on the second redistribution wiring layer.

6. The semiconductor package of claim 1, wherein the first heat dissipation block and the second heat dissipation block are each attached to an upper surface of the second redistribution wiring layer by an adhesive film.

7. The semiconductor package of claim 1, wherein the first heat dissipation block and the second heat dissipation block are respectively on a first heat dissipation pad and a second heat dissipation pad, and the first heat dissipation pad and the second heat dissipation pad are in an upper surface of the second redistribution wiring layer.

8. The semiconductor package of claim 1, wherein the sealing member exposes an upper surface of the first lower semiconductor chip and an upper surface of the second lower semiconductor chip.

9. The semiconductor package of claim 8, wherein the second redistribution wiring layer exposes at least portions of the exposed upper surface of the first lower semiconductor chip exposed by the sealing member and the exposed upper surface of the second lower semiconductor chip exposed by the sealing member, and the first heat dissipation block and the second heat dissipation block are respectively on the exposed upper surface of the first lower semiconductor chip exposed by the second redistribution wiring layer and the exposed upper surface of the second lower semiconductor chip exposed by the second redistribution wiring layer.

10. The semiconductor package of claim 1, wherein the first lower semiconductor chip and the second lower semiconductor chip comprise logic chips, and the upper semiconductor chip comprises a memory chip.

11. A semiconductor package, comprising:

a first redistribution wiring layer including a first chip mounting region and a second chip mounting region spaced apart from each other, a connector region between the first chip mounting region and the second chip mounting region, and first redistribution wirings;

a first lower semiconductor chip and a second lower semiconductor chip respectively mounted on the first chip mounting region and on the second chip mounting region;

a sealing member covering at least a portion of the first lower semiconductor chip and the second lower semiconductor chip;

a second redistribution wiring layer on the sealing member and including second redistribution wirings;

a plurality of conductive vias on the connector region, the plurality of conductive vias penetrating the sealing member such that the plurality of conductive vias electrically connect the first redistribution wirings to the second redistribution wirings;

an upper semiconductor chip on the second redistribution wiring layer such that the upper semiconductor chip is electrically connected to the second redistribution wirings;

a first heat dissipation block on the first lower semiconductor chip; and a second heat dissipation block on the second lower semiconductor chip.

12. The semiconductor package of claim 11, wherein the first lower semiconductor chip and the second lower semiconductor chip have a thickness within a range of 100 μm to 300 μm, and the plurality of conductive vias have a height within a range of 200 μm to 300 μm.

13. The semiconductor package of claim 11, wherein the second redistribution wiring layer overlaps the plurality of conductive vias.

14. The semiconductor package of claim 11, wherein the first heat dissipation block and the second heat dissipation block are on the second redistribution wiring layer.

15. The semiconductor package of claim 11, wherein the first heat dissipation block and the second heat dissipation block are each attached to an upper surface of the second redistribution wiring layer by an adhesive film.

16. The semiconductor package of claim 11, wherein the first heat dissipation block and the second heat dissipation block are respectively on a first heat dissipation pad and a second heat dissipation pad provided, and the first heat dissipation pad and the second heat dissipation pad are in an upper surface of the second redistribution wiring layer.

17. The semiconductor package of claim 11, wherein the sealing member exposes an upper surface of the first lower semiconductor chip and an upper surface of the second lower semiconductor chip.

18. The semiconductor package of claim 17, wherein the second redistribution wiring layer exposes at least portions of the exposed upper surface of the first lower semiconductor chip exposed by the sealing member and the exposed upper surface of the second lower semiconductor chip exposed by the sealing member, and the first heat dissipation block and the second heat dissipation block are respectively on the exposed upper surface of the first lower semiconductor chip exposed by the second redistribution wiring layer and the exposed upper surface of the second lower semiconductor chip exposed by the second redistribution wiring layer.

19. The semiconductor package of claim 11, wherein the first heat dissipation block and the second heat dissipation block include at least one of a metal or silicon material.

20. A semiconductor package, comprising:

a first redistribution wiring layer including a first chip mounting region and a second chip mounting region spaced apart from each other, a connector region between the first chip mounting region and the second chip mounting region, and first redistribution wirings;

a first lower semiconductor chip including first lower chip pads, the first lower semiconductor chip mounted on the first chip mounting region of the first redistribution wiring layer with first conductive bumps on the first lower chip pads;

a second lower semiconductor chip including second lower chip pads, the second lower semiconductor chip mounted on the second chip mounting region of the first redistribution wiring layer with second conductive bumps on the second lower chip pads;

a sealing member covering at least a portion of the first lower semiconductor chip and the second lower semiconductor chip on the first redistribution wiring layer;

a second redistribution wiring layer on the sealing member and including second redistribution wirings;

a plurality of conductive vias on the connector region, the plurality of conductive vias penetrating the sealing member such that the plurality of conductive vias electrically connect the first redistribution wirings to the second redistribution wirings;

an upper semiconductor chip on the second redistribution wiring layer such that the upper semiconductor chip is electrically connected to the second redistribution wirings;

a first heat dissipation block on the first lower semiconductor chip; and a second heat dissipation block on the second lower semiconductor chip.

* * * * *